US012690300B2

(12) United States Patent
Kim et al.

(10) Patent No.: US 12,690,300 B2
(45) Date of Patent: Jul. 21, 2026

(54) LIGHT-EMITTING ELEMENT AND DISPLAY DEVICE INCLUDING THE SAME

(71) Applicant: Samsung Display Co., LTD., Yongin-si (KR)

(72) Inventors: Dong Gyun Kim, Seoul (KR); Jun Bo Sim, Suwon-si (KR); Hee Yeon Yoo, Hwaseong-si (KR); Jeong In Choi, Anyang-si (KR); Chul Jong Yoo, Seongnam-si (KR); Yo Han Lee, Hwaseong-si (KR); Sung Ae Jang, Busan (KR); Hyun Min Cho, Seoul (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 588 days.

(21) Appl. No.: 17/992,656

(22) Filed: Nov. 22, 2022

(65) Prior Publication Data

US 2023/0282778 A1 Sep. 7, 2023

(30) Foreign Application Priority Data

Mar. 2, 2022 (KR) .......................... 10-2022-0026563

(51) Int. Cl.
H10H 20/831 (2025.01)
H01L 25/075 (2006.01)
(Continued)

(52) U.S. Cl.
CPC ...... H10H 20/8312 (2025.01); H10H 20/857 (2025.01); H10W 90/00 (2026.01)

(58) Field of Classification Search
CPC .. H10H 20/8312; H10H 20/857; H10H 20/84; H10H 29/142; H10H 20/831; H01L 25/0753; H10W 90/00
See application file for complete search history.

(56) References Cited

U.S. PATENT DOCUMENTS

| 7,057,211 B2 | 6/2006 | Dwilinski et al. |
| 7,750,355 B2 | 7/2010 | Dwilinski et al. |
| | (Continued) | |

FOREIGN PATENT DOCUMENTS

| JP | H01-5286723 B2 | 9/2013 |
| JP | H01-5491679 81 | 5/2014 |
| | (Continued) | |

OTHER PUBLICATIONS

Luo et al, Elasticity and Anisotropy of Titanium Oxide TixOy, 2016, p. 4 (Year: 2016).*

(Continued)

*Primary Examiner* — Marlon T Fletcher
*Assistant Examiner* — Samuel Jonathan Smith
(74) *Attorney, Agent, or Firm* — Womble Bond Dickinson (US) LLP

(57) ABSTRACT

A light-emitting element comprises a core comprising a first semiconductor layer, a second semiconductor layer provided on the first semiconductor layer, and an emissive layer provided between the first semiconductor layer and the second semiconductor layer, and a first element insulating film around a side surface of the core, wherein the first element insulating film comprises a composite of an insulating member and an elastic member.

20 Claims, 24 Drawing Sheets

(51) Int. Cl.
     *H10H 20/857*     (2025.01)
     *H10W 90/00*     (2026.01)

(56)            References Cited

U.S. PATENT DOCUMENTS

| | | | |
|---|---|---|---|
| 7,935,550 B2 | 5/2011 | Dwilinski et al. | |
| 2008/0023691 A1 | 1/2008 | Jang et al. | |
| 2011/0235184 A1* | 9/2011 | Park | G02B 1/11 |
| | | | 977/773 |
| 2016/0195222 A1* | 7/2016 | Liu | F21V 29/70 |
| | | | 362/84 |
| 2019/0305035 A1 | 10/2019 | Cho et al. | |
| 2019/0378953 A1 | 12/2019 | Min et al. | |
| 2020/0043976 A1* | 2/2020 | Kim | H10H 20/856 |
| 2024/0047505 A1* | 2/2024 | Daanoune | H10H 20/818 |

FOREIGN PATENT DOCUMENTS

| | | | |
|---|---|---|---|
| KR | 20040049323 A | 6/2004 |
| KR | 2007-0046224 A | 5/2007 |
| KR | 2011-0040676 A | 4/2011 |
| KR | 10-2012-0029284 A | 3/2012 |
| KR | 2012-0069302 A | 6/2012 |
| KR | 10-2012-0122160 A | 11/2012 |
| KR | 2016-0059569 A | 5/2016 |

OTHER PUBLICATIONS

Extended European Search Report for corresponding European Patent Application No. 23157491.4, dated Aug. 1, 2023, 8pp.

\* cited by examiner

[CRACK OCCURS]                    [SEPARATION]

200: 210, 220
400: 410, 420
700: 710, 720

DR6

DR4

DR5

200 : 210, 220
400 : 410, 420
700 : 710, 720
ED_2 : 30, 38_3, 391, 392

LIGHT-EMITTING ELEMENT AND DISPLAY DEVICE INCLUDING THE SAME

CROSS-REFERENCED TO RELATED APPLICATION

This application claims priority to and the benefit of Korean Patent Application No. 10-2022-0026563 filed on Mar. 2, 2022 in the Korean Intellectual Property Office, the entire content of which is incorporated herein by reference.

BACKGROUND

1. Field

One or more embodiments of the present disclosure relate to a light-emitting element and a display device including the same.

2. Description of the Related Art

Display devices become more and more important as multimedia technology evolves. Accordingly, a variety of types (or kinds) of display devices such as organic light-emitting display (OLED) devices and liquid-crystal display (LCD) devices are currently used.

Display devices include a display panel such as an organic light-emitting display panel and/or a liquid-crystal display panel for displaying images. A display panel may include light-emitting elements, which may be light-emitting diodes (LEDs). Examples of the light-emitting diodes may include an organic light-emitting diode using an organic material as a light-emitting material, an inorganic light-emitting diode using an inorganic material as a light-emitting material, etc.

SUMMARY

Aspects of embodiments of the present disclosure provide a light-emitting element having an even (or a substantially even) cut surface during a process of separating the light-emitting element from a lower substrate, and a display device including the same.

It should be noted that embodiments of the present disclosure are not limited to the above-mentioned embodiment; and other embodiments of the present disclosure will be apparent to those skilled in the art from the following descriptions.

According to one or more embodiments of the disclosure, a light-emitting element comprises a core comprising a first semiconductor layer, a second semiconductor layer on the first semiconductor layer, and an emissive layer between the first semiconductor layer and the second semiconductor layer, and a first element insulating film surrounding (e.g., around) a side surface of the core, wherein the first element insulating film comprises a composite of an insulating member and an elastic member.

In one or more embodiments, the elastic member is formed to surround (e.g., is around) a border of the insulating member, and a space between the insulating member and another insulating member is filled with (e.g., includes) the elastic member.

In one or more embodiments, the elastic member is provided to partially surround (e.g., is partially around) a side surface of the first semiconductor layer.

In one or more embodiments, the insulating member is on the elastic member and is provided to partially surround (e.g., is partially around) a side surface of the second semiconductor layer.

In one or more embodiments, the first element insulating film comprises a plurality of layers of the insulating member and the elastic member arranged alternately with each other.

In one or more embodiments, the insulating member comprises at least one of amorphous $SiO_2$ or amorphous $Al_2O_3$.

In one or more embodiments, the elastic member comprises at least one of graphene or carbon nanotubes.

In one or more embodiments, the elastic member comprises an insulating material having an elastic modulus of 150 GPa or more.

In one or more embodiments, the elastic member comprises at least one of $HfO_2$ or $ZrO_2$.

According to one or more embodiments of the disclosure, a light-emitting element comprises a core comprising a first semiconductor layer, a second semiconductor layer on the first semiconductor layer, and an emissive layer between the first semiconductor layer and the second semiconductor layer, a first element insulating film surrounding (e.g., around) a side surface of the core, and a second element insulating film surrounding (e.g., around) an outer surface of the first element insulating film, wherein the first element insulating film comprises a crystalline insulating material, and wherein an elastic modulus of the first element insulating film is greater than an elastic modulus of the second element insulating film.

In one or more embodiments, the first element insulating film has an elastic modulus of 150 GPa or more.

In one or more embodiments, the first element insulating film comprises at least one of $HfO_2$ or $ZrO_2$.

In one or more embodiments, the first element insulating film comprises a composite material doped with at least one of aluminum (Al), scandium (Sc), yttrium (Y), lanthanum (La), lutetium (Lu), or lawrencium (Lr).

In one or more embodiments, the second element insulating film comprises at least one of amorphous $SiO_2$ or amorphous $Al_2O_3$.

According to one or more embodiments of the disclosure, a display device comprises a first electrode and a second electrode on a substrate and spaced apart from each other, light-emitting elements between the first electrode and the second electrode, and each of the light emitting elements having a first end and a second end, a first connection electrode in contact with the first end of each of the light-emitting elements, and a second connection electrode in contact with the second end of each of the light-emitting elements, wherein each of the light-emitting elements comprises a core comprising a first semiconductor layer, a second semiconductor layer on the first semiconductor layer, and an emissive layer between the first semiconductor layer and the second semiconductor layer, and a first element insulating film surrounding (e.g., around) a side surface of the core, wherein the first element insulating film comprises a crystalline insulating material with an elastic modulus of 150 GPa or more, and wherein the first semiconductor layer, the emissive layer, and the second semiconductor layer are sequentially arranged in a direction crossing a thickness direction of the substrate.

In one or more embodiments, the first element insulating film comprises at least one of $HfO_2$ or $ZrO_2$.

In one or more embodiments, each of the light-emitting elements comprises a second element insulating film surrounding (e.g., around) a side surface of the first element insulating film, wherein the second element insulating film comprises an amorphous insulating material with an elastic modulus of 150 GPa or less, and wherein the core, the first element insulating film, and the second element insulating film are sequentially arranged in a thickness direction of the substrate.

In one or more embodiments, the second element insulating film comprises at least one $SiO_2$ or $Al_2O_3$.

In one or more embodiments, the first element insulating film further comprises an amorphous insulating material, and forms a composite of the amorphous insulating material and the crystalline insulating material.

In one or more embodiments, the first element insulating film comprises a plurality of layers of the amorphous insulating material and the crystalline insulating material arranged alternately with each other.

According to embodiments of the present disclosure, a light-emitting element comprises a first element insulating film having an elastic member. During a process of separating light-emitting elements from a lower substrate, external cracks propagate evenly (or substantially evenly) along the elastic member of the first element insulating film, so that a height difference of the cut surface of the light-emitting elements can be reduced.

According to one or more other embodiments of the present disclosure, a light-emitting element may include a first element insulating film having a crystalline insulating material. The first element insulating film can allow external cracks to propagate evenly (or substantially evenly), thereby reducing the height difference of the cut surface of the light-emitting elements.

According to embodiments of the present disclosure, the cut surfaces of the light-emitting elements of the display device can become even (or substantially even), so that the light-emitting efficiency of the display device can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in more detail embodiments thereof with reference to the attached drawings, in which.

4

Figure 12:
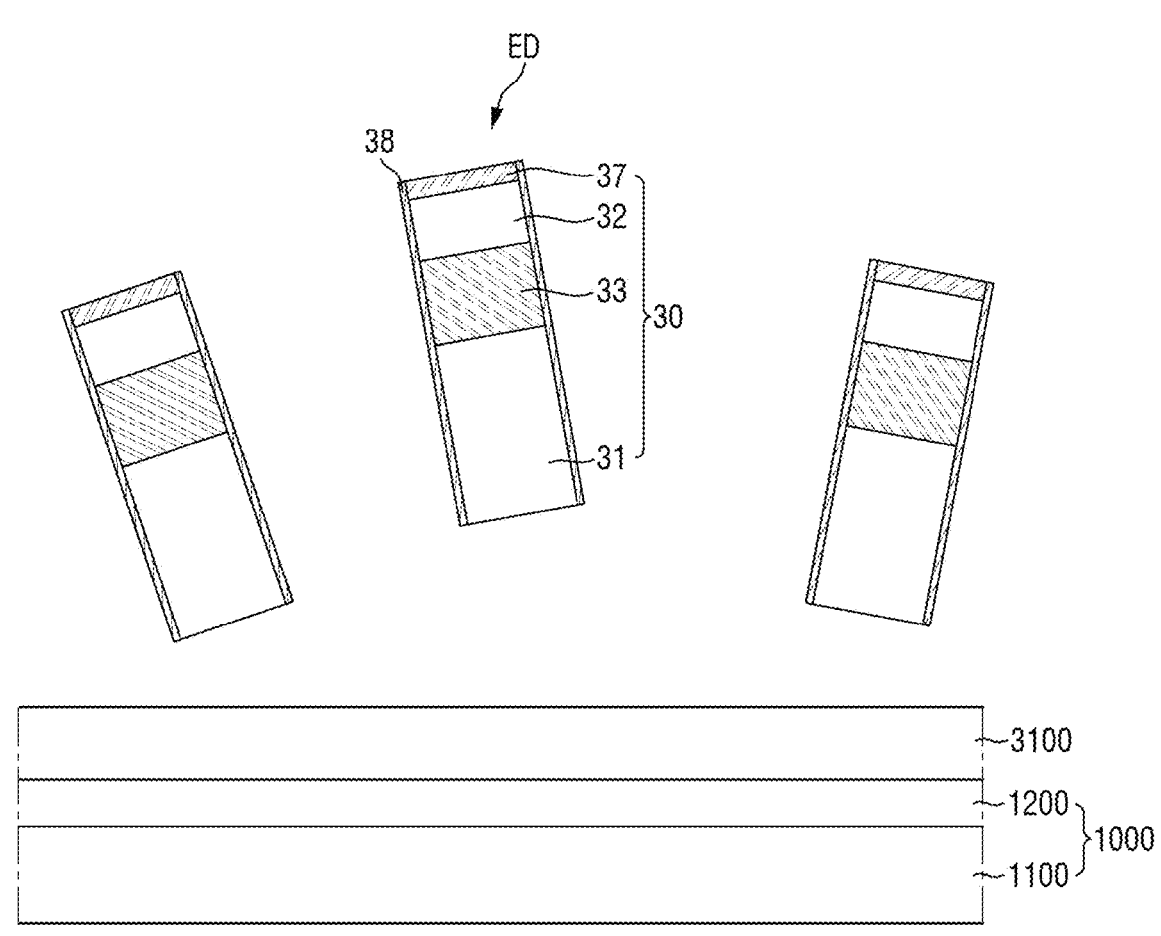
Figure 12:
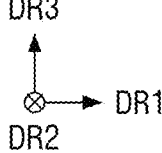
Figure 13:
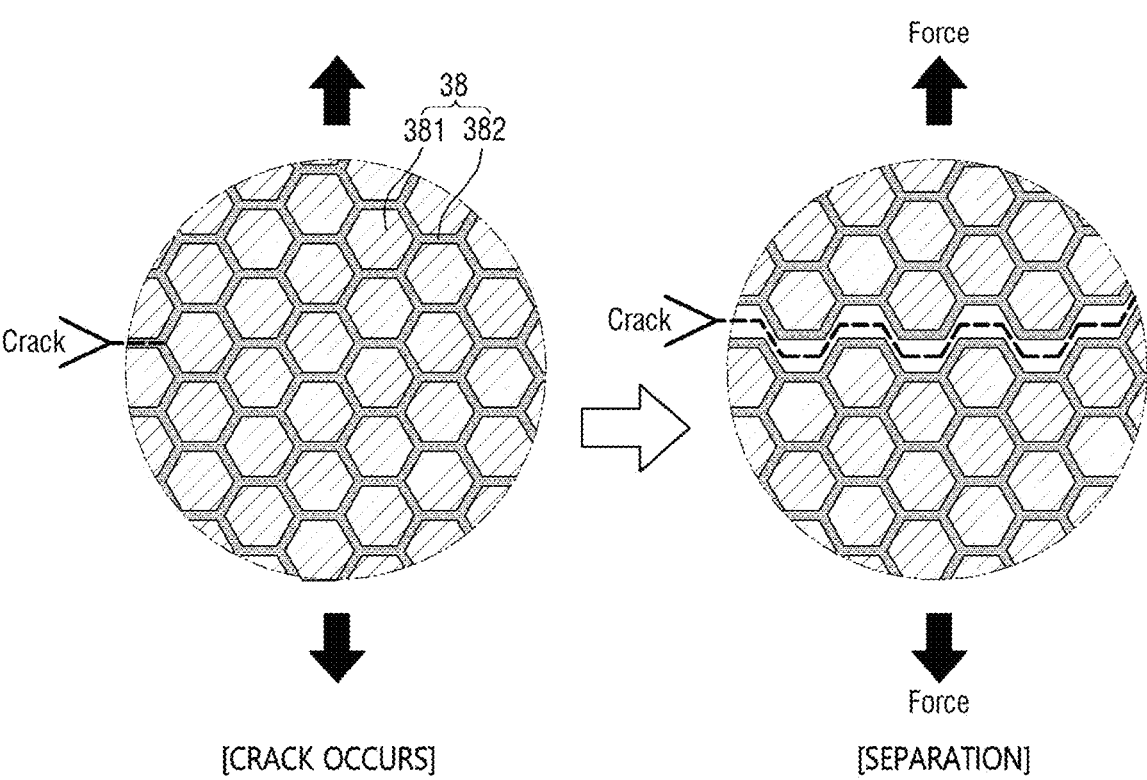

FIG. 13 is an enlarged view conceptually depicting a first element insulating film according to the separation process of FIG. 12.

Figure 4:
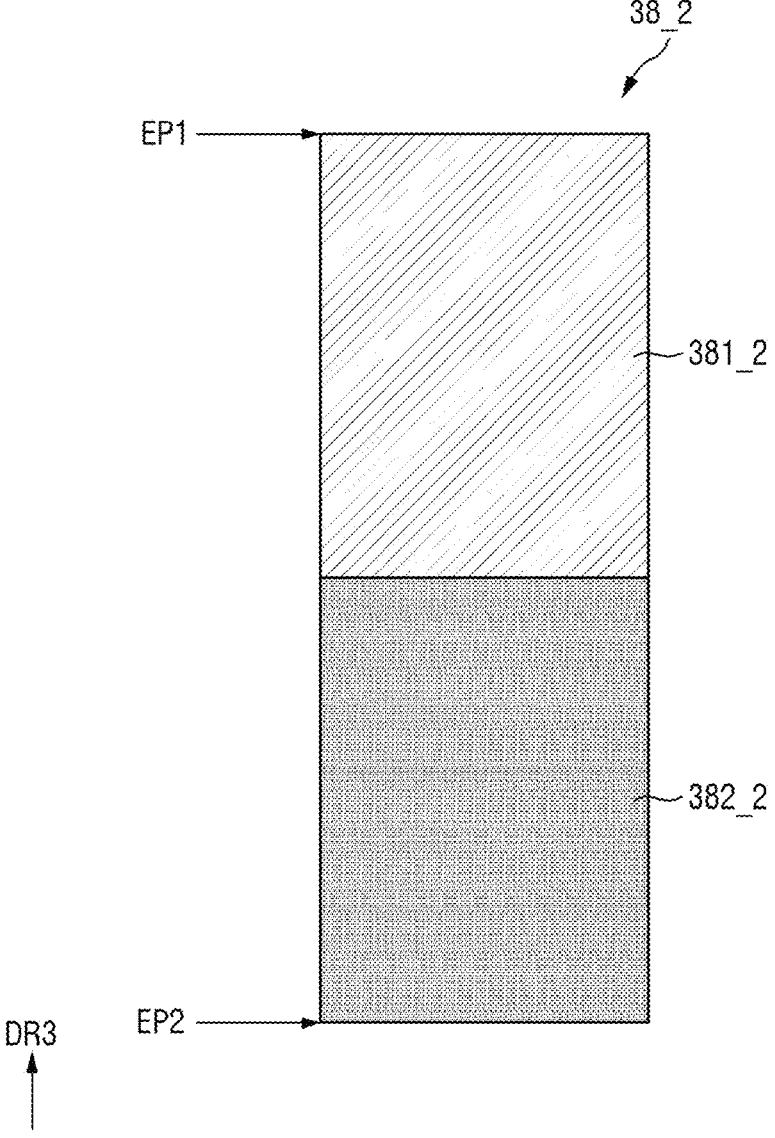
FIG. 4 is an enlarged cross-sectional view of a first element insulating film according to one or more other embodiments.
Figure 14:
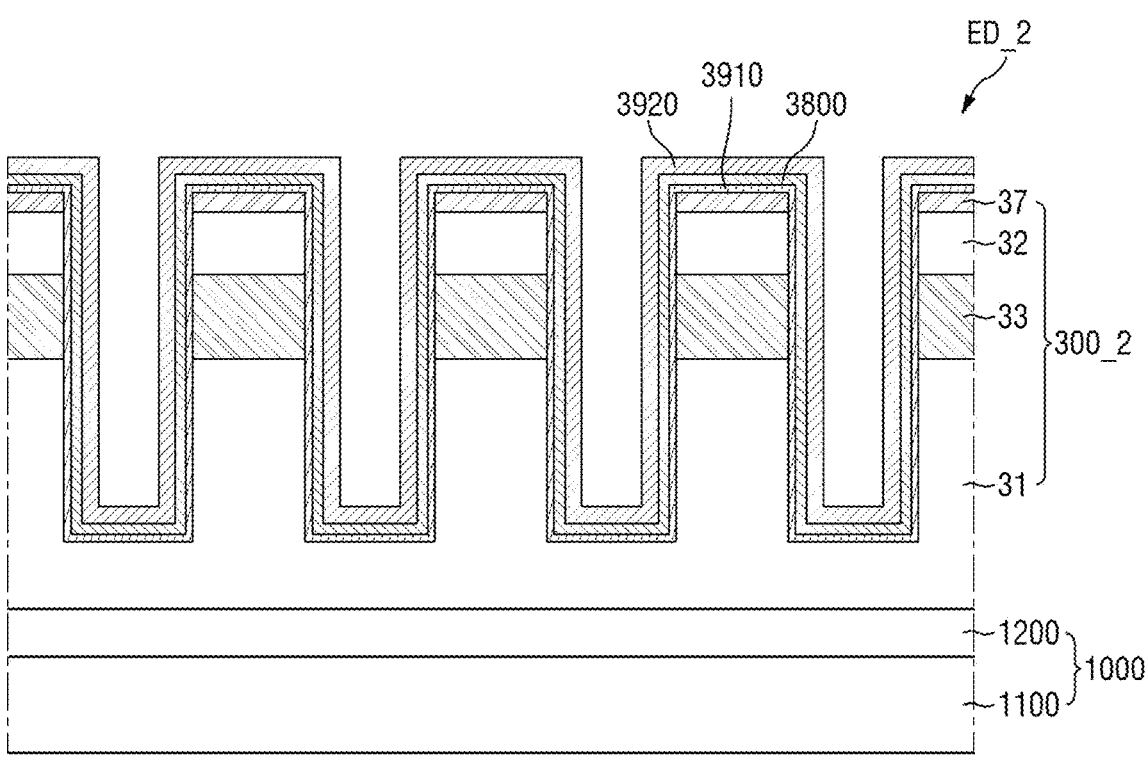
Figure 14:
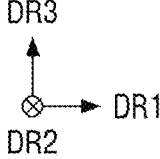
Figure 15:
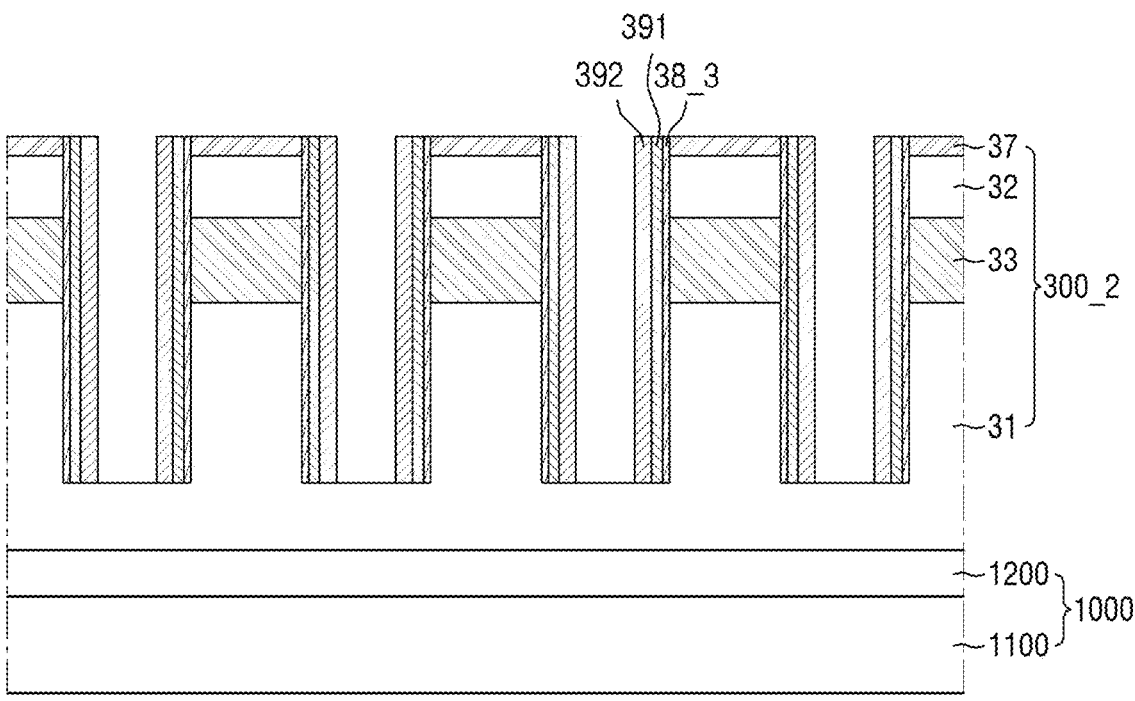
Figure 15:
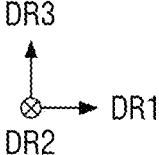
Figure 16:
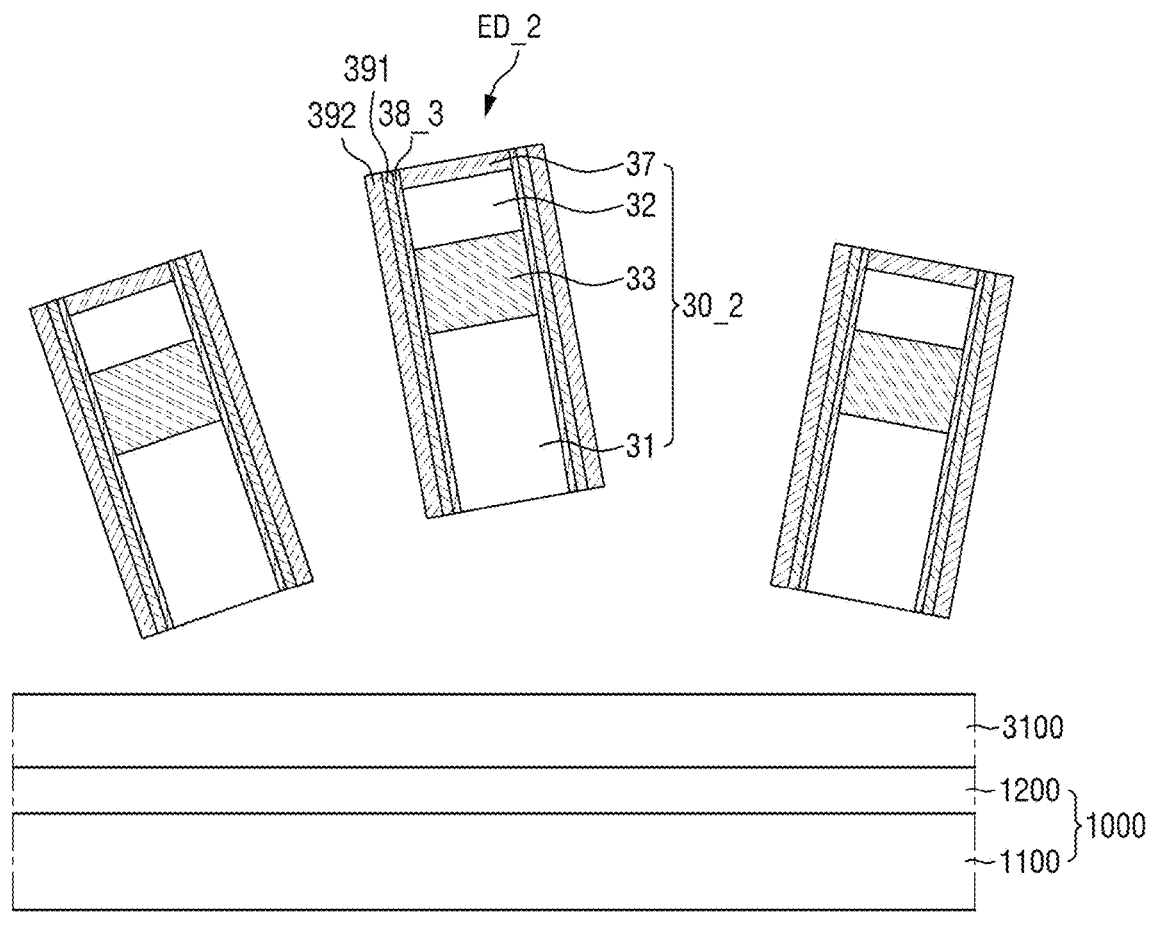
Figure 16:
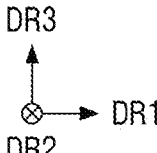

FIGS. 14-16 are cross-sectional views showing processing steps of a method of fabricating light-emitting elements according to FIG. 4.

Figure 17:
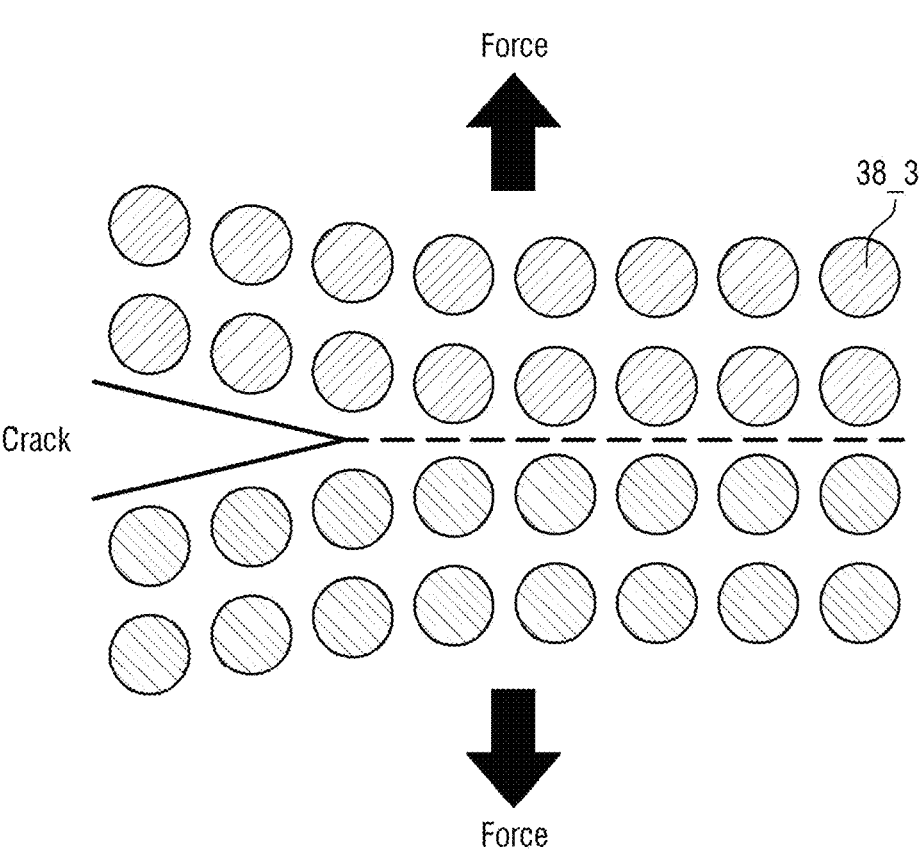

FIG. 17 is an enlarged view conceptually depicting the first element insulating film according to the separation process of FIG. 16.

Figure 18A:
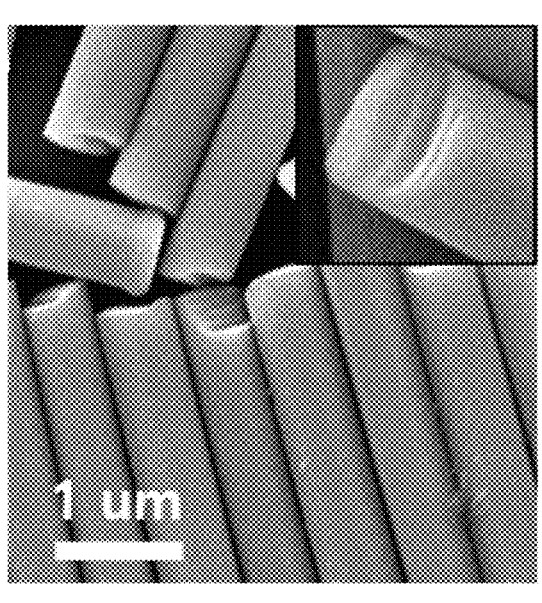
Figure 18B:
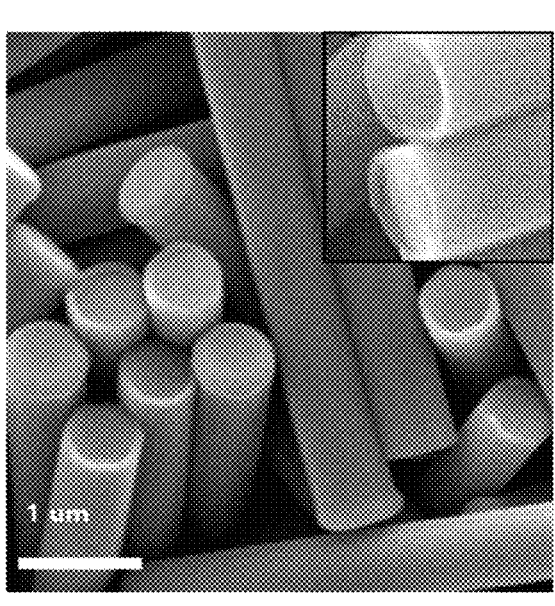

FIGS. 18A and 18B show images of light-emitting elements according to one or more embodiments of the present disclosure and light-emitting elements according to Comparative Example.

Figure 19:
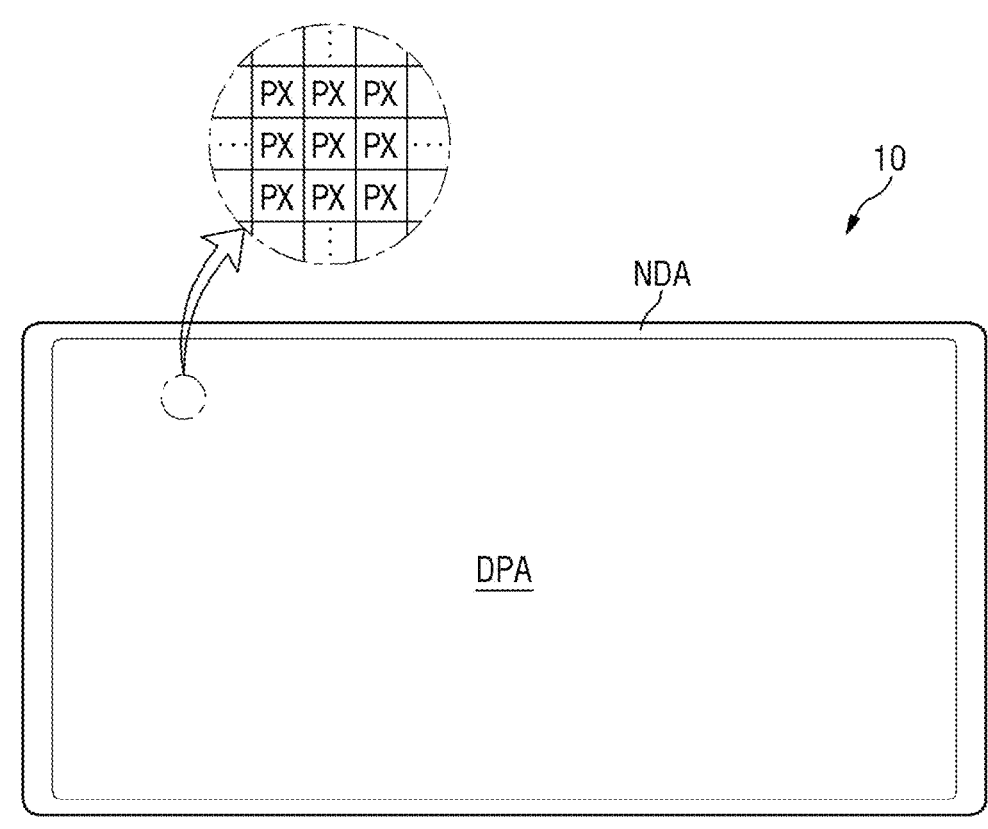
Figure 19:
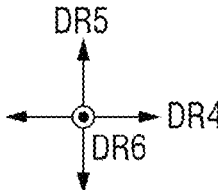

FIG. 19 is a plan view of a display device according to one or more embodiments of the present disclosure.

Figure 20:
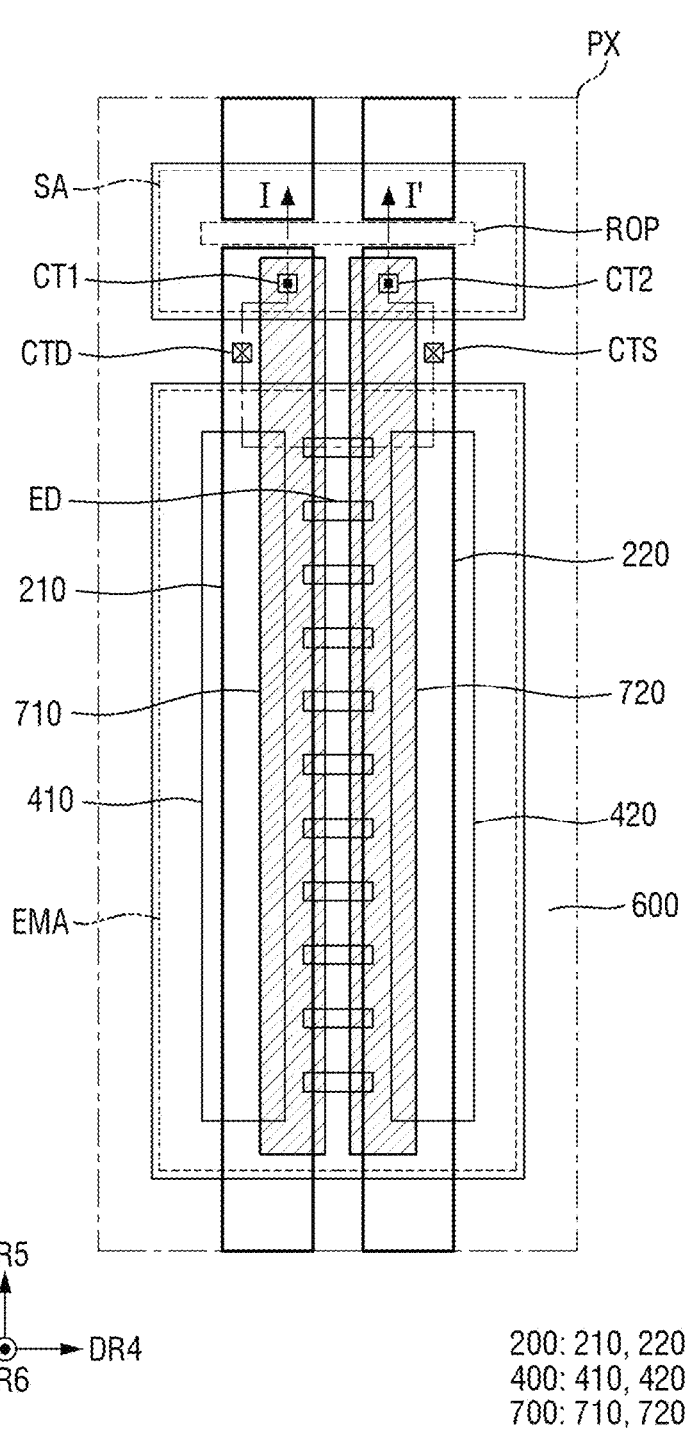

FIG. 20 is a plan view showing a layout of a pixel of a display device according to one or more embodiments of the present disclosure.

Figure 21:
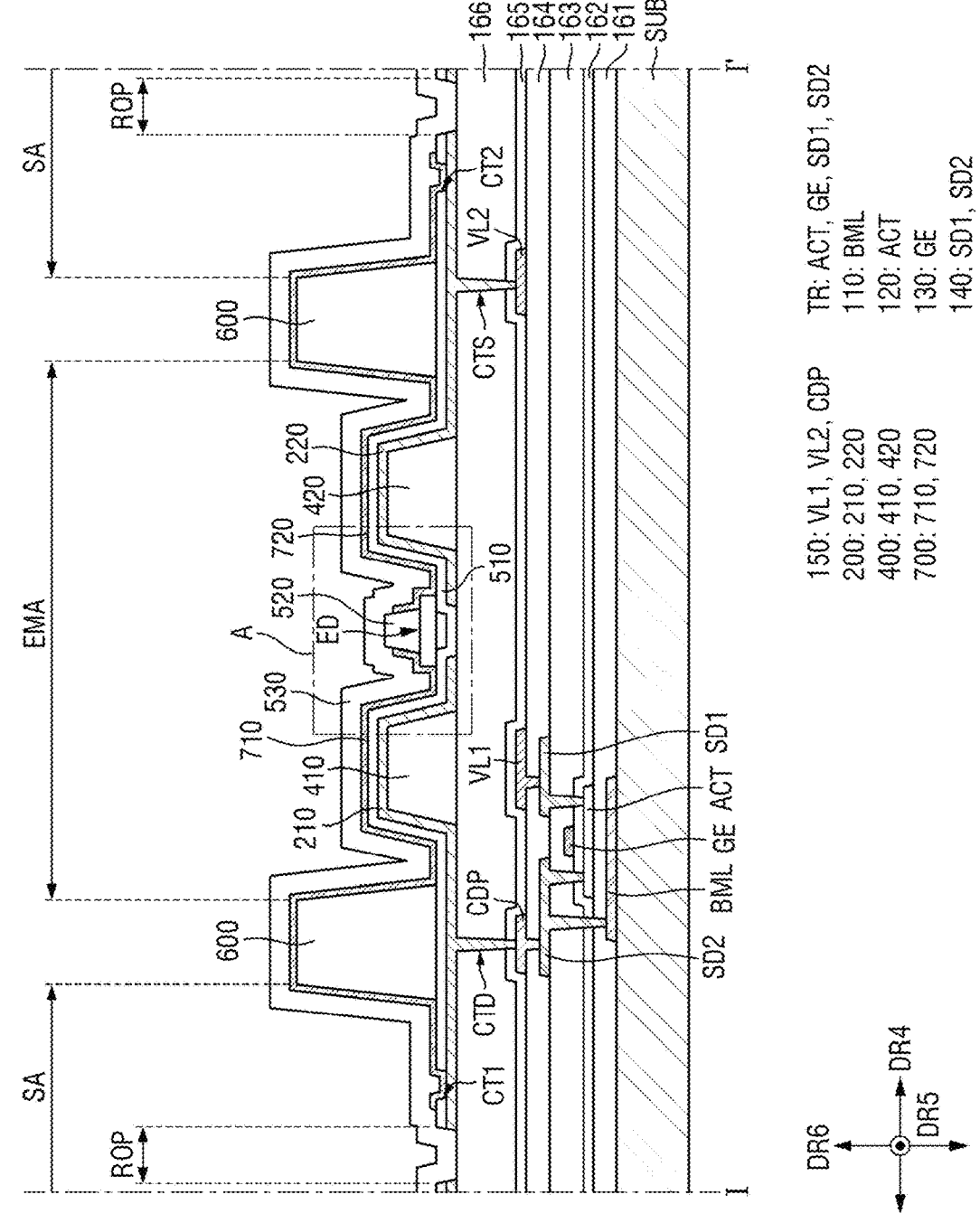

FIG. 21 is a cross-sectional view showing an example of a cross-section taken along line I-I' of FIG. 20.

Figure 22:
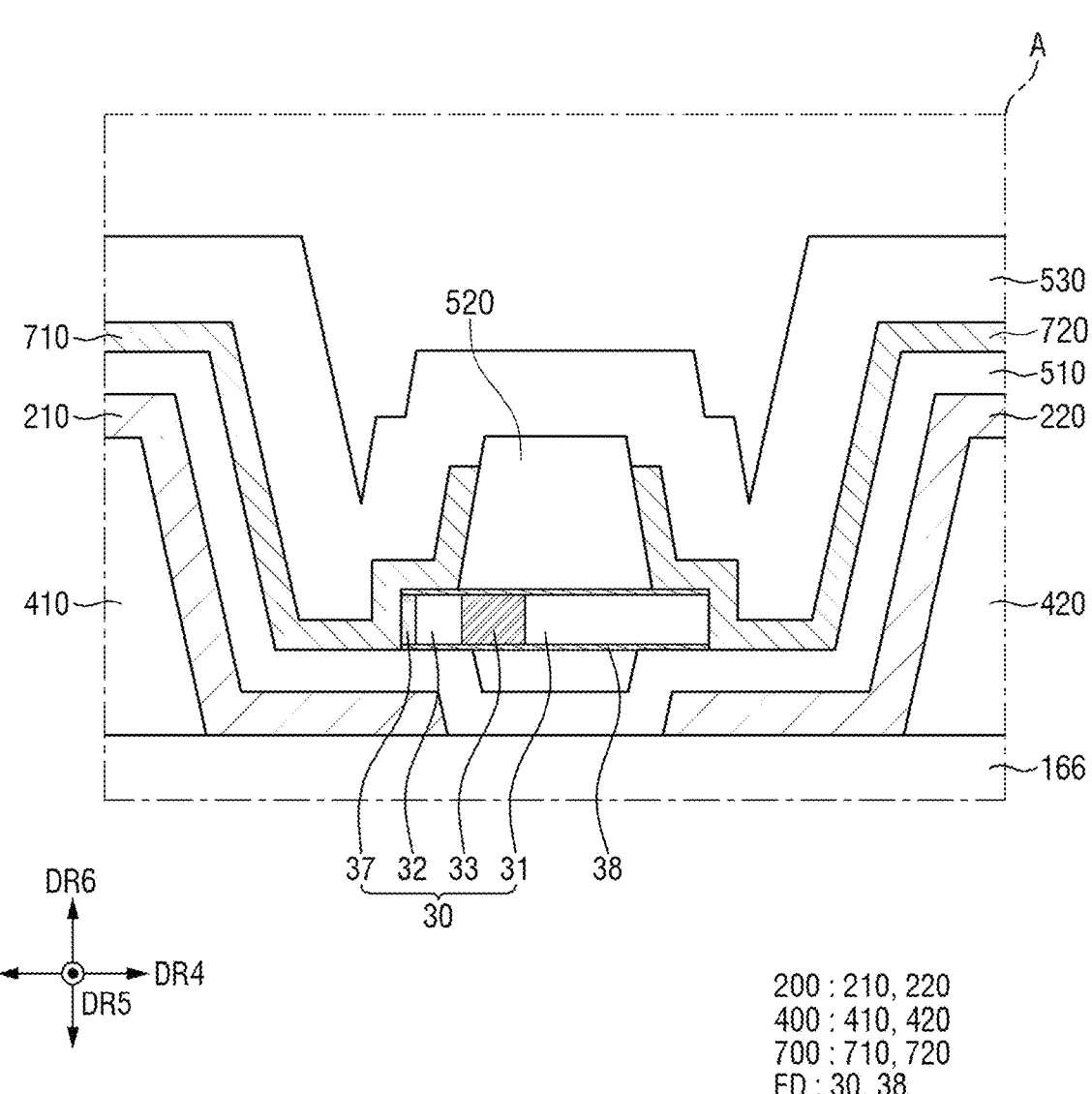

FIG. 22 is an enlarged cross-sectional view showing an example of area A of FIG. 21.

Figure 23:
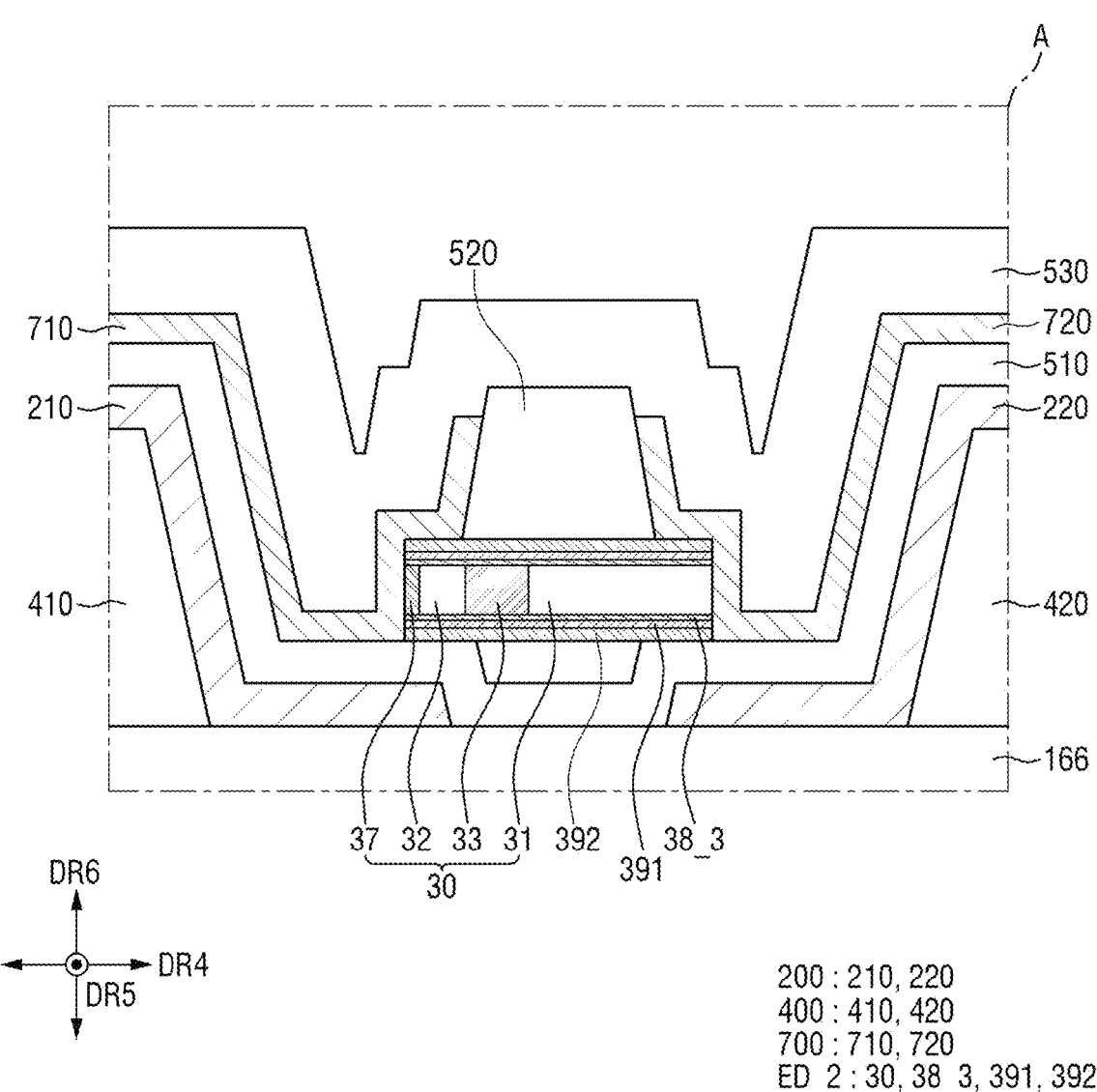

FIG. 23 is an enlarged cross-sectional view showing another example of area A of FIG. 21.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate (e.g., without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items. Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate.

Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 1:
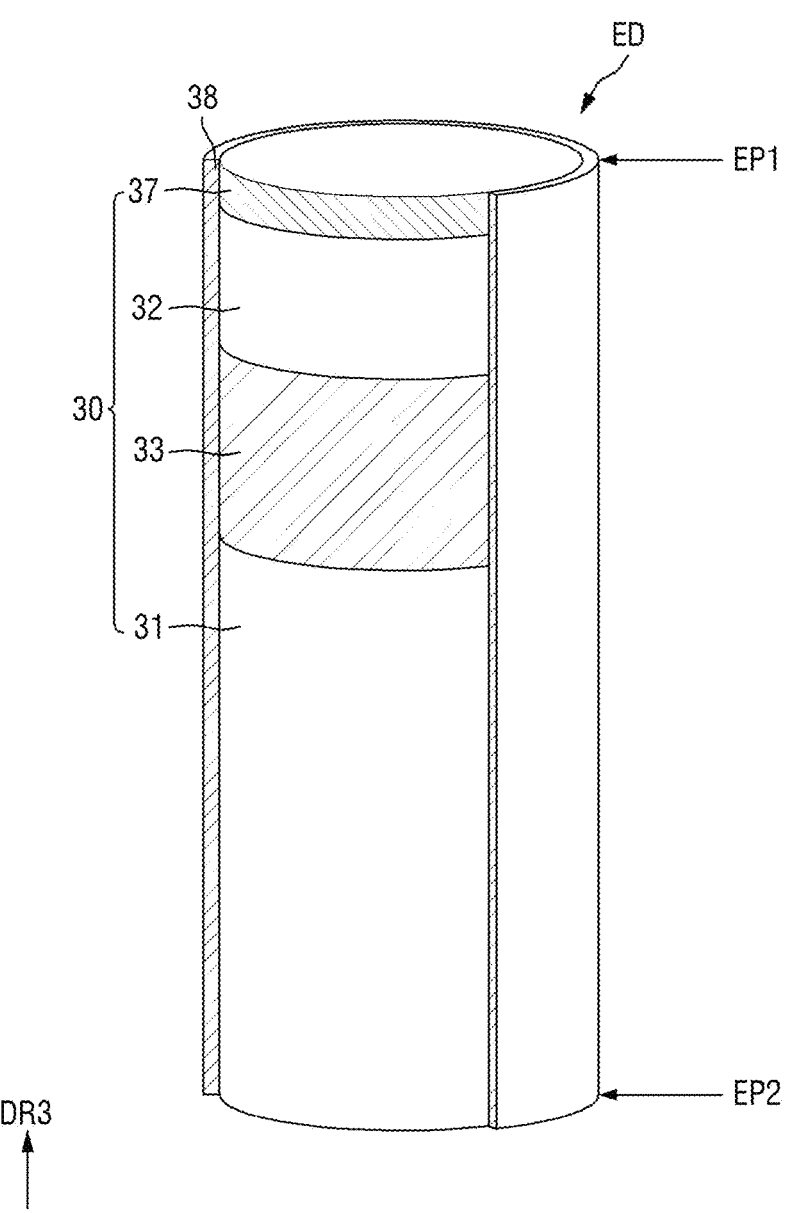
FIG. 1 is a schematic perspective view of a light-emitting element according to one or more embodiments of the present disclosure.
Figure 2:
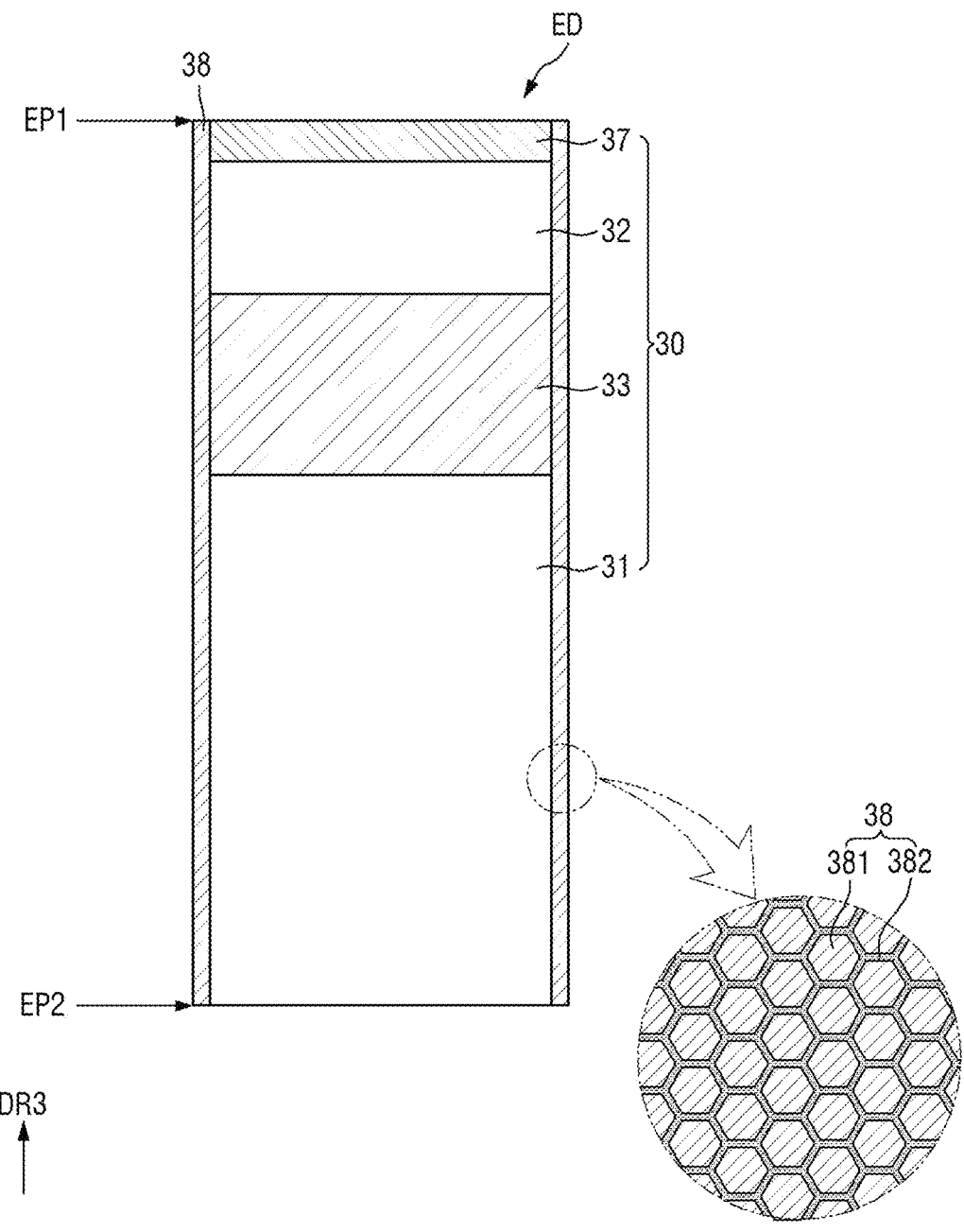
FIG. 2 is an enlarged view of the light-emitting element and a first element insulating film according to the embodiments of the present disclosure.

FIG. 1 is a schematic perspective view of a light-emitting element according to one or more embodiments of the present disclosure. FIG. 2 is an enlarged view of the light-emitting element and a first element insulating film according to the embodiments of the present disclosure.

Referring to FIGS. 1 and 2, the light-emitting element ED is a particulate element, and may have a rod-like and/or cylindrical shape having a set or predetermined aspect ratio. The light-emitting element ED has a shape extended in one direction DR3. The length of the light-emitting element ED in the extending (or extension) direction (or longitudinal direction, DR3) is greater than the diameter of the light-emitting element ED. For example, the light-emitting element ED may have a shape of a rod, wire, tube, etc., a shape of a polygonal column such as a cube, a cuboid and/or a hexagonal column, or may have a shape extended in a direction with partially inclined outer surface. In the following description and the drawings for illustrating the shape of the light-emitting element ED, the terms of one direction DR3, the extension direction DR3 of the light-emitting element ED, and the longitudinal direction DR3 of the light-emitting element ED may be used interchangeably.

The light-emitting elements ED may have a size of a nanometer scale (from 1 nm to 1 μm) to a micrometer scale (from 1 μm to 1 mm). It should be understood, however, that the present disclosure is not limited thereto. The length of the light-emitting element ED in the extending direction DR3 may be approximately 1 to 10 μm, for example, 4 to 5 μm. The diameter of the light-emitting element ED may be 500 nm. The aspect ratio of the light-emitting element ED may be 1.2:1 to 100:1, but the present disclosure is not limited thereto.

According to one or more embodiments of the present disclosure, the light-emitting element ED may be an inorganic light-emitting diode made of an inorganic material. The inorganic light-emitting diode may include a plurality of semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light. Inorganic light-emitting diodes may be aligned between two electrodes facing each other as polarities are created by forming an electric field in a particular direction between the two electrodes.

The light-emitting element ED may include a core 30 and a first element insulating film 38. The core 30 may have a shape extended in one direction DR3. The core 30 may have a rod and/or cylindrical shape. It should be understood, however, that the present disclosure is not limited thereto. The core 30 may have a polygonal column shape such as a cube, a cuboid and/or a hexagonal column, or may have a shape extended in the direction DR3 with an outer surface partially inclined.

The core 30 may include a first semiconductor layer 31, a second semiconductor layer 32, an emissive layer 33, and an element electrode layer 37. The first semiconductor layer 31, the emissive layer 33, the second semiconductor layer 32 and the element electrode layer 37 may be sequentially stacked on one another along the direction DR3 which is the longitudinal direction of the core 30.

In the following description of the light-emitting elements ED according to the embodiments, "upper side" refers to one side of the core 30 in the direction DR3 where the element electrode layer 37 is provided, and "top surface" refers to a surface facing one way in the direction DR3, unless specifically stated otherwise. In addition, the "lower side" refers to the opposite side of the core 30 in the direction DR3 where the first semiconductor layer 31 is provided, and "bottom surface" refers to a surface facing the opposite way in the direction DR3. The upper side of a light-emitting element ED may be referred to as a first end EP1, while the lower side of the light-emitting element ED may be referred to as a second end EP2.

The first semiconductor layer 31 may be an n-type semiconductor. The first semiconductor layer 31 may include a semiconductor material having the following chemical formula: $Al_xG_yIn_{1-x-y}N$ ($0 \leq x \leq 1$, $0 \leq y \leq 1$, $0 \leq x+y \leq 1$). For example, the first semiconductor layer 31 may be one or more of AlGaInN, GaN, AlGaN, InGaN, AlN or InN doped with n-type dopant. The n-type dopant doped into the first semiconductor layer 31 may be Si, Ge, Sn, Se, etc.

The second semiconductor layer 32 is provided above the first semiconductor layer 31 with the emissive layer 33 therebetween. The second semiconductor layer 32 may be a p-type semiconductor, and may include a semiconductor material having the following chemical formula: $Al_xG_yIn_{1-x-y}N$ ($0 \leq x \leq 1$, $0 \leq y \leq 1$, $0 \leq x+y \leq 1$). For example, the second semiconductor layer 32 may be one or more of AlGaInN, GaN, AlGaN, InGaN, AlN or InN doped with p-type dopant. The p-type dopant doped into the second semiconductor layer 32 may be Mg, Zn, Ca, Ba, etc.

Although each of the first semiconductor layer 31 and the second semiconductor layer 32 is implemented as a single layer in the drawings, the present disclosure is not limited thereto. Depending on the material of the emissive layer 33, the first semiconductor layer 31 and the second semiconductor layer 32 may further include a larger number of layers, e.g., a clad layer and/or a tensile strain barrier reducing (TSBR) layer. For example, the light-emitting elements ED may further include another semiconductor layer provided between the first semiconductor layer 31 and the emissive layer 33 or between the second semiconductor layer 32 and the emissive layer 33. The semiconductor layer provided between the first semiconductor layer 31 and the emissive layer 33 may be one or more of AlGaInN, GaN, AlGaN, InGaN, AlN, or InN doped with an n-type dopant. The semiconductor layer provided between the second semiconductor layer 32 and the emissive layer 33 may be one or more of AlGaInN, GaN, AlGaN, InGaN, AlN, or InN doped with a p-type dopant.

The emissive layer 33 is provided between the first semiconductor layer 31 and the second semiconductor layer 32. The emissive layer 33 may include a material having a single or multiple quantum well structure. When the emissive layer 33 includes a material having the multiple quantum well structure, the structure may include quantum layers and well layers alternately stacked on one another. The emissive layer 33 may emit light as electron-hole pairs are combined therein in response to an electrical signal applied through the first semiconductor layer 31 and the second semiconductor layer 32. The emissive layer 33 may include a material such as AlGaN, AlGaInN, and/or InGaN. For example, when the emissive layer 33 has a multi-quantum well structure in which quantum layers and well layers are alternately stacked on one another, the quantum layers may include AlGaN and/or AlGaInN, and the well layers may include a material such as GaN and/or AlGaN.

The emissive layer 33 may have a structure in which a semiconductor material having a relatively large band gap energy and a semiconductor material having a relatively small band gap energy are alternately stacked on one another, and may include other Group III to Group V semiconductor materials depending on the wavelength range of the emitted light. Accordingly, the light emitted from the emissive layer 33 is not limited to the light of the blue wavelength band. The emissive layer 36 may emit light of red and/or green wavelength band in some implementations.

The light emitted from the emissive layer 33 may exit not only through the end surfaces of the light-emitting element ED in the third direction DR3, which is the longitudinal direction, but also through the side surfaces of the light-emitting element ED. The direction in which the light emitted from the emissive layer 33 propagates is not limited to one direction.

The element electrode layer 37 may be an ohmic connection electrode. It is, however, to be understood that the present disclosure is not limited thereto. The element electrode layer 37 may be a Schottky connection electrode. The light-emitting element ED may include at least one element electrode layer 37. The light-emitting element ED may include one or more electrode layers 37. It is, however, to be understood that the present disclosure is not limited thereto. The element electrode layer 37 may be eliminated.

The element electrode layer 37 may be provided between the second semiconductor layer 32 and electrodes to reduce the resistance when the both ends of the light-emitting element ED are electrically connected to the electrodes to apply electric signals to the first and second semiconductor layers 31 and 32. The element electrode layer 37 may include a metal having conductivity. For example, the element electrode layer 37 may include at least one of aluminum (Al), titanium (Ti), indium (In), gold (Au), silver (Ag), ITO, IZO or ITZO.

The first element insulating film 38 may be provided to surround (e.g., to be around) the side surface (or outer circumferential surface) of the core 30. The first element insulating film 38 may be provided to surround the side surfaces of the plurality of semiconductor layers and/or the element electrode layer 37 included in the core 30. The first element insulating film 38 may be provided to surround at least side surfaces of the first semiconductor layer 31, the emissive layer 33 and the second semiconductor layer 32, and may be extended in one direction DR3 in which the core 30 is extended.

The first element insulating film 38 may surround the side surface of the core 30 and expose both end surfaces of the core 30 (top and bottom surfaces of the core 30 in FIG. 1). Because the first element insulating film 38 is not provided on the end surfaces of the core 30, portions of the element electrode layer 37 and the first semiconductor layer 31 of the core 30 may be exposed by the first element insulating film 38.

The first element insulating film 38 may include a material having insulating properties. According to the embodiments of the present disclosure, the first element insulating film 38 may include a composite of a material having insulating properties and a material having elastic properties. The first element insulating film 38 may include a composite in which an insulating member 381 and an elastic member 382 are combined. The insulating member 381 and the elastic member 382 of the first element insulating film 38 may have different phases, and a macroscopic interface may be formed between the insulating member 381 and the elastic member 382.

The insulating member 381 of the first element insulating film 38 may include a crystalline or amorphous insulating material. Although not limited thereto, the insulating member 381 may work as, but is not limited to, a matrix of the composite. For example, the insulating member 381 may include amorphous silicon oxide ($SiO_2$) and/or amorphous aluminum oxide ($Al_2O_3$). When the insulating member 381 includes an amorphous insulating material, the elastic modulus of the insulating member 381 may be smaller than the elastic modulus of the elastic member 382. For example, the elastic modulus of the insulating member 381 may be equal to or less than 150 GPa. Although not limited thereto, the elastic modulus of silicon oxide ($SiO_2$) may range from 66 GPa to 75 GPa, and the elastic modulus of aluminum oxide ($Al_2O_3$) may range from 115 GPa to 170 GPa. As used herein, the crystalline material includes a polycrystalline phase as well as a monocrystalline phase. As used herein, the amorphous material may include no crystallization region.

The elastic member 382 of the first element insulating film 38 may work as a reinforcement and/or a filler of the composite material. Because the elastic member 382 has a higher elastic modulus than the insulating member 381, it can transmit (e.g., distribute) cracks caused by external shock evenly (or substantially evenly). The elastic member 382 may be coupled with the insulating member 381 to prevent or reduce the transmission of external shock to the insulating member 381. The elastic member 382 may include a polymer material including carbon and/or a crystalline insulating material. For example, when the elastic member 382 is made of a polymer material, the elastic member 382 may include graphene and/or carbon nanotubes.

For another example, when the elastic member 382 is made of a crystalline insulating material, it may include a crystalline metal material having an elastic modulus of 150 GPa or more. For example, the elastic member 382 may include hafnium oxide ($HfO_2$) and/or zirconium oxide ($ZrO_2$). Although not limited thereto, the modulus of elasticity of hafnium oxide ($HfO_2$) may range from 171 GPa to 186 GPa, and the modulus of elasticity of zirconium oxide ($ZrO_2$) may be 220 GPa. There may be a difference in elastic modulus in a material due to defects or microcrystal in the material.

Referring to FIG. 2, the elastic member 382 may be formed to surround the insulating member 381. The space between the materials of the insulating member 381 may be filled with the elastic member 382. For example, the elastic member 382 may be a filler surrounding (e.g., around) the insulating member 381 made of an amorphous insulating material. The first element insulating film 38 may have a single-layer structure of the composite in which the insulating member 381 and the elastic member 382 are combined. Although not limited thereto, the first element insulating film 38 may have a layered structure of the composite.

Although in the example shown in the drawings, the insulating member 381 of the first element insulating film 38 has a hexagonal structure and the elastic member 382 has a hexagonal ring structure surrounding (e.g., around) the interface of the insulating member 381, the coupling form of the composite material of the first element insulating film 38 is not limited thereto. For example, the insulating member 381 may have a circular structure, and the elastic member 382 may have a circular ring structure surrounding (e.g., around) the interface of the insulating member 381.

The first element insulating film 38 can protect the semiconductor layers and the electrode layer of the light-emitting element ED. The first element insulating film 38 can prevent or reduce an electrical short-circuit that may occur in the emissive layer 33 if it comes in direct contact with the electrode through which an electric signal is transmitted to the light-emitting element ED. In addition, the first element insulating film 38 can prevent or reduce a decrease in light-emitting efficiency.

In some embodiments, the outer surface of the first element insulating film 38 may be subjected to surface treatment. The light-emitting elements ED may be dispersed in an ink, and the ink may be sprayed onto the electrode. In doing so, the surface treatment may be applied to the first element insulating film 38 so that it becomes hydrophobic or hydrophilic in order to keep the light-emitting elements ED dispersed in the ink from being aggregated with one another.

The first element insulating film 38 including the insulating member 381 and the elastic member 382 is in direct contact with the side surface of the core 30, so that it is possible to address (e.g., mitigate) the defects of the second end EP2 of the light-emitting element ED. The surface of the second end EP2 (i.e., the lower surface) of the light-emitting element ED may be the lower surface of the first semiconductor layer 31 during a cutting process to separate semiconductor rods 300 (see FIG. 11) from a first semiconductor material layer 3100 (see FIG. 12) in the processes of fabricating the light-emitting element ED, as will be described herein below. In the process of separating the lower surface of the first semiconductor layer 31 from the first semiconductor material layer 3100, cracks may unevenly propagate to the lower surface of the first semiconductor layer 31 by external stress. As a result, there may be a height difference on the second end EP2 of the light-emitting element ED (e.g., between multiple light-emitting elements ED), and accordingly, poor contact may occur in the display device 10 (see FIG. 22), possibly lowering the quantum efficiency of the light-emitting element ED.

According to the embodiments of the present disclosure, the first element insulating film 38 forms the composite of the insulating member 381 and the elastic member 382, thereby improving the evenness of the second end EP2 of the light-emitting element ED and increasing the quantum efficiency of the light-emitting element ED. In the process of separating the lower surface of the first semiconductor layer 31 from the first semiconductor material layer 3100, cracks caused by external stress can be evenly (or substantially evenly) transmitted (e.g., distributed) along the elastic member 382 of the first element insulating film 38, thereby reducing the height difference (variations in height) of the lower surface of the semiconductor layer 31.

Hereinafter, referring to FIGS. 3 and 4, first element insulating films 38_1 and 38_2 of light-emitting elements having a multi-layer structure in which insulating members 381_1 and 381_2 and elastic members 382_1 and 382_2 are stacked on one another will be described, as compared with the first element insulating film 38 having a single-layer structure in which the insulating member 381 and the elastic member 382 are combined. The first element insulating films 38_1 and 38_2 form composites in which insulating members 381_1 and 381_2 and elastic members 382_1 and 382_2 are combined, as in the above-described embodiment.

Figure 3:
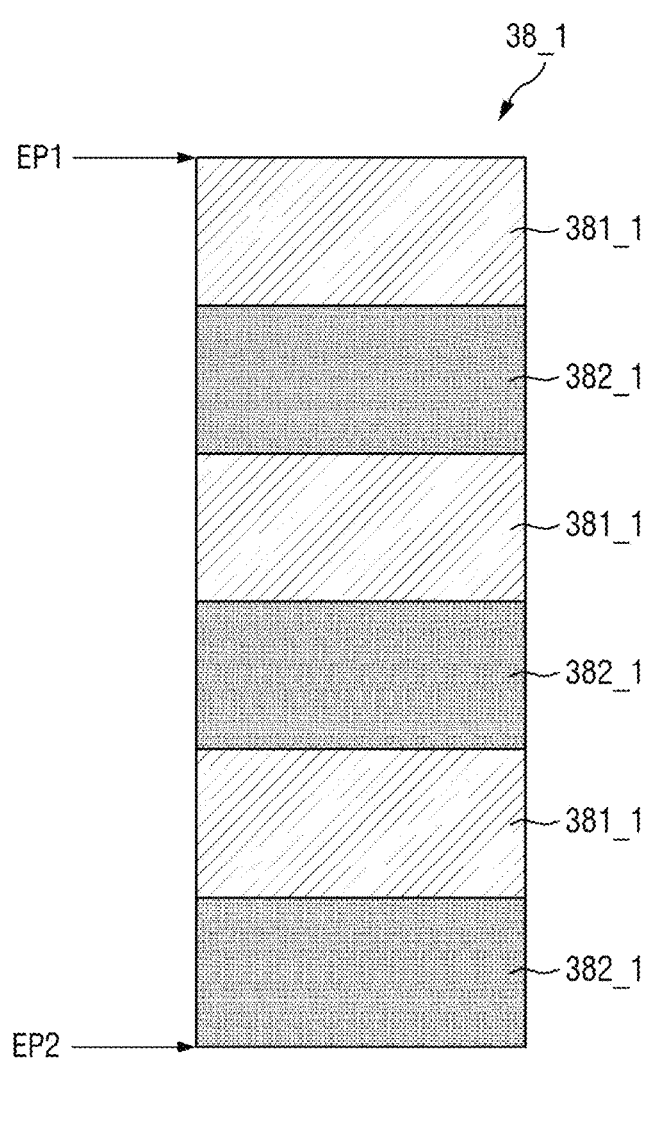
FIG. 3 is an enlarged cross-sectional view of a first element insulating film according to one or more other embodiments.

FIG. 3 is an enlarged cross-sectional view of a first element insulating film according to one or more other embodiments. FIG. 4 is an enlarged cross-sectional view of a first element insulating film according to one or more other embodiments.

Referring to FIGS. 3 and 4, the first element insulating films 38_1 and 38_2 may be formed to surround the side surface of the core 30, and may be extended from the first end EP1 to the second end EP2 of the light-emitting element ED along the longitudinal direction DR3 of the light-emitting element ED.

Referring to FIG. 3, the first element insulating film 38_1 may have a multi-layer structure in which insulating members 381_1 and elastic members 382_1 are arranged alternately with each other. An insulating member 381_1 may be formed between the adjacent elastic members 382_1, and an elastic member 382_1 may be formed between the adjacent insulating members 381_1. The elastic member 382_1 may be provided at the second end EP2 that is the bottom of the light-emitting element ED and may surround the side surface of the first semiconductor layer 31 (see FIG. 2) provided at the second end EP2. Although the insulating member 381_1 is provided at the first end EP1 that is the top of the light-emitting element ED in the example in FIG. 3, the present disclosure is not limited thereto. The elastic member 382_1 may be provided at the first end EP1 of the light-emitting element ED. For example, the element electrode layer 37 may be surrounded by the insulating member or may be surrounded by the elastic member 382_1.

Referring to FIG. 4, the first element insulating film 38_2 may have a double-layer structure in which an insulating member 381_2 is provided on an elastic member 382_2. The elastic member 382_2 may be provided at the second end EP2 that is the bottom of the light-emitting element ED and may surround the side surface of the first semiconductor layer 31 provided at the second end EP2. The insulating member 381_2 may be provided at the first end EP1 that is the top of the light-emitting element ED and may be provided to surround the side surface of the element electrode layer 37 provided at the first end EP1. Although not limited thereto, the insulating member 381_2 may be provided to surround the side surfaces of the second semiconductor layer 32 (see FIG. 2) and the emissive layer 33 (see FIG. 2) near the first end EP1 of the light-emitting element ED.

According to the embodiments of the present disclosure, each of the elastic members 382_1 and 382_2 of the first element insulating films 38_1 and 38_2 may be provided to surround the second end EP2 that is the bottom of the light-emitting element ED. For example, the elastic members 382_1 and 382_2 may be provided to surround the lower portion (e.g., lower side) of the first semiconductor layer 31. In this manner, the evenness of the second end EP2 of the light-emitting element ED can be improved, so that the quantum efficiency of the light-emitting element ED can be increased. As the elastic members 382_1 and 382_2 are provided to surround the lower portion of the first semiconductor layer 31, it is possible to prevent or reduce the uneven propagation of cracks to the lower surface of the first semiconductor layer 31 during the process of separating the first semiconductor layer 31 from the first semiconductor material layer 3100 (see FIG. 11) of semiconductor rods 300 (see FIG. 11) to be described herein below. The elastic members 382_1 and 382_2 provided to surround the lower surface of the first semiconductor layer 31 can work as a crack transfer layer that evenly (or substantially evenly) transmits (e.g., distributes) cracks, thereby reducing the height difference (e.g., height variation) of the lower surface of the first semiconductor layer 31.

Figure 5:
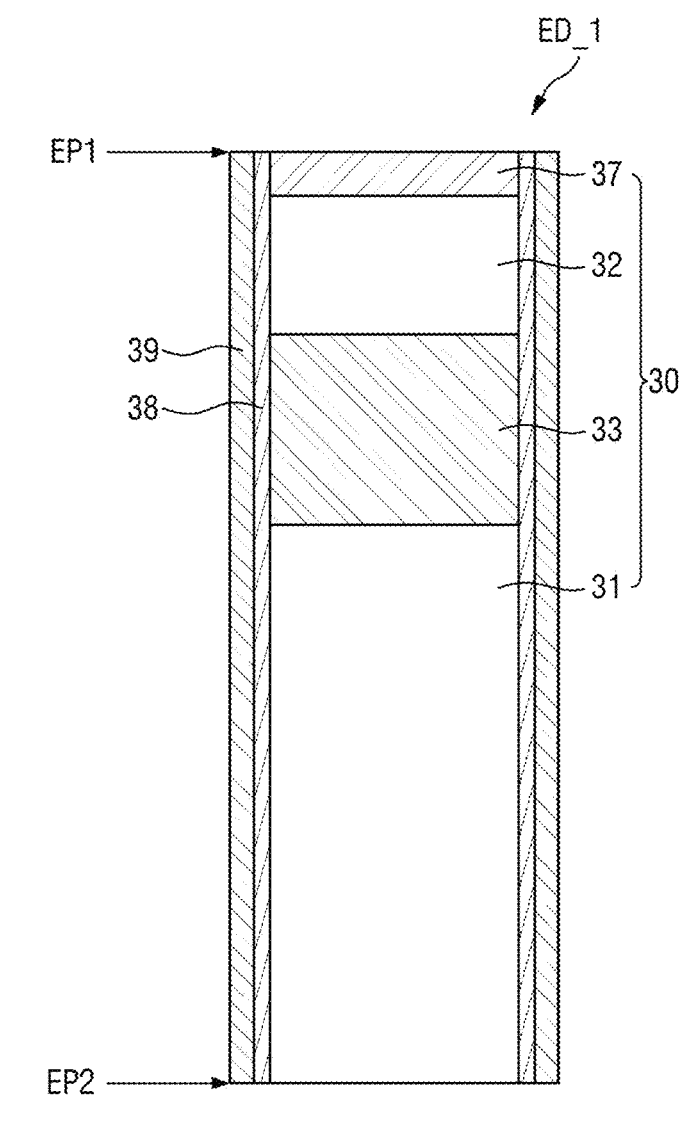
FIG. 5 is a cross-sectional view showing a light-emitting element according to one or more other embodiments of the present disclosure.

FIG. 5 is a cross-sectional view showing a light-emitting element according to one or more other embodiments of the present disclosure.

A light-emitting element ED_1 of FIG. 5 may be in contact with a first element insulating film 38 forming (e.g., formed by) a composite of an insulating member 381 (see FIG. 2) and an elastic member 382 (see FIG. 2) as in the above-described embodiments, but it further includes a second element insulating film 39 surrounding (e.g., around) the outer surface of the first element insulating film 38.

The second element insulating film 39 may be provided on the outer surface (or the outer circumferential surface) of the first element insulating film 38. The second element insulating film 39 may surround the outer surface of the first element insulating film 38. The first element insulating film 38 may be provided between the core 30 and the second element insulating film 39.

The second element insulating film 39 may be extended in one direction DR3. Similar to the first element insulating film 38, the second element insulating film 39 may cover the side surface of the core 30 while exposing both end surfaces of the core 30. Although the second element insulating film 39 is extended in the longitudinal direction DR3 of the light-emitting element ED to cover from the first semiconductor layer 31 to the side surface of the element electrode layer 37 in the example shown in the drawing, the present disclosure is not limited thereto.

The second element insulating film 39 may include a material having insulating properties, e.g., aluminum oxide ($Al_2O_3$), silicon oxide (SiOx), silicon nitride (SiNx), hafnium oxide (HfOx), etc. The first element insulating film 38 may be made up of a single film including the above-described material or a multilayer structure in which these are stacked on one another.

Figure 6:
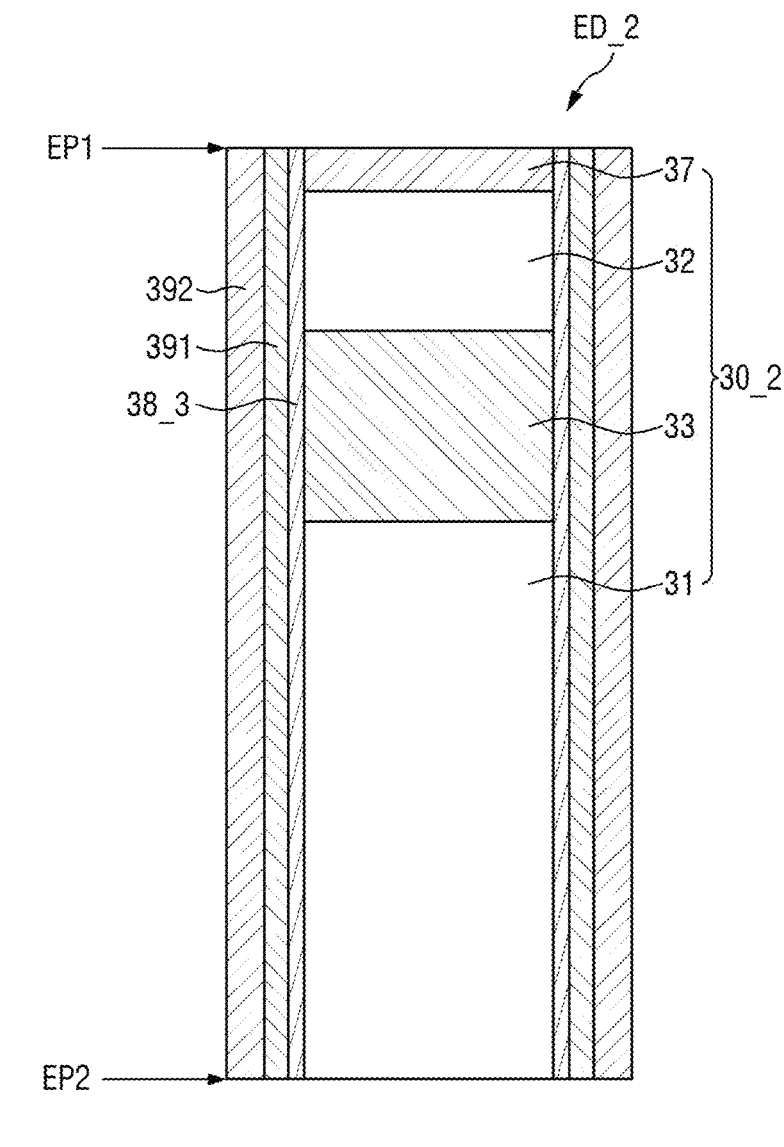
FIG. 6 is a cross-sectional view of a light-emitting element according to one or more other embodiments of the present disclosure.

FIG. 6 is a cross-sectional view of a light-emitting element according to one or more other embodiments of the present disclosure.

Referring to FIG. 6, a light-emitting element ED_2 according to the embodiments may include a first element insulating film 38_3 in direct contact with the side surface of a core 30_2, a second element insulating film 391 provided on the outer surface of the first element insulating film 38_3, and a third element insulating film 392 provided on the outer surface of the second element insulating film 391. Unlike the above-described embodiments, the first element insulating film 38_3 of the light-emitting element ED_2 may not be formed of a composite of the elastic member 382 (see FIG.

2) and the insulating member 381 (see FIG. 2) but may include a crystalline insulating material.

For example, the first element insulating film 38_3 may include a crystalline material having an elastic modulus of 150 GPa or more. For example, the elastic member 382 may include hafnium oxide ($HfO_2$) and/or zirconium oxide ($ZrO_2$). Although not limited thereto, the modulus of elasticity of hafnium oxide ($HfO_2$) may range from 171 GPa to 186 GPa, and the modulus of elasticity of zirconium oxide ($ZrO_2$) may be 220 GPa.

The first element insulating film 38_3 may be formed of a single material including the crystalline material, but the present disclosure is not limited thereto. It may be formed of a material doped with one or more suitable elements. For example, the crystalline material may be used by doping aluminum (Al), scandium (Sc), yttrium (Y), lanthanum (La), lutetium (Lu), and/or lawrencium (Lr).

The second element insulating film 391 and the third element insulating film 392 may include a material having insulating properties, e.g., aluminum oxide ($Al_2O_3$), silicon oxide (SiOx), silicon nitride (SiNx), hafnium oxide (HfOx), etc. The second element insulating film 391 and the third element insulating film 392 may have a single film including any of the above-described materials or a multi-layer structure in which plurality of films including any of the above-described materials are stacked on one another. For example, when the second element insulating film 391 and the third element insulating film 392 include an amorphous insulating material, the elastic modulus of the second element insulating film 391 and the third element insulating film 392 may be 150 GPa or less. For example, the elastic modulus of amorphous silicon oxide ($SiO_2$) may range from 66 GPa to 75 GPa, and the elastic modulus of amorphous aluminum oxide ($Al_2O_3$) may range from 115 GPa to 170 GPa. In one or more embodiments, the elastic modulus of the second element insulating film 391 and the third element insulating film 392 may be smaller than the elastic modulus of the first element insulating film 38_3.

According to the embodiments of the present disclosure, the first element insulating film 38_3 is in direct contact with the side surface of the light-emitting element ED including the second end EP2 of the light-emitting element ED, so that it is possible to prevent or reduce the uneven propagation of cracks due to external stress to the first semiconductor layer 31 in the process of separating the light-emitting element ED to be described herein below. Because the first element insulating film 38_3 includes a crystalline insulating material having a relatively high elastic modulus, cracks can be evenly (or substantially evenly) transmitted (e.g., propagated). The lower surface of the first semiconductor layer 31 may be separated evenly (or substantially evenly) from the first semiconductor material layer 3100 (see FIG. 12) by the cracking. The lower surface of the first semiconductor layer 31 may have a flat (or substantially flat) surface having a height difference of 300 nm or less. For example, the evenness of the second end EP2 of the light-emitting element ED can be improved.

FIGS. 7 to 12 are cross-sectional views showing processing steps of a method of fabricating a light-emitting element according to FIG. 2. FIG. 13 is an enlarged view conceptually depicting a first element insulating film according to the separation process of FIG. 12.

A first direction DR1, a second direction DR2 and a third direction DR3 are defined in the drawings. The method of fabricating a light-emitting diode ED according to one or more embodiments of the present disclosure will be described with reference to the drawings. The first direction DR1 and the second direction DR2 may be perpendicular (or substantially perpendicular) to each other, and the third direction DR3 may be perpendicular (or substantially perpendicular) to the plane where the first direction DR1 and the second direction DR2 are located. The third direction DR3 may be the extension direction (or the longitudinal direction) of the light-emitting element ED or the one direction as described above.

In the following description of embodiments of processing steps of fabricating a light-emitting element ED, the upper side refers to one side in the third direction DR3 where a plurality of semiconductor layers of the light-emitting element ED is stacked on one another from the surface (or the upper surface) of the lower substrate 1000, and the upper surface refers to the surface facing toward the one side in the third direction DR3, unless specifically stated otherwise. In addition, the lower side refers to the opposite side in the third direction DR3, and the lower surface refers to a surface facing toward the opposite side in the third direction DR3.

Figure 7:
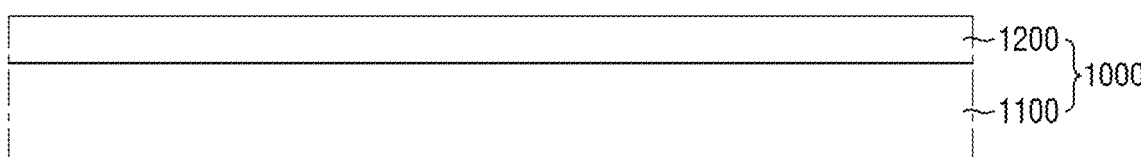
FIGS. 7-12 are cross-sectional views showing processing steps of a method of fabricating a light-emitting element according to FIG. 2.
Figure 7:
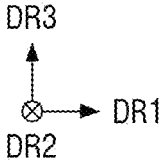

Referring first to FIG. 7, a lower substrate 1000 is prepared.

The lower substrate 1000 may include a base substrate 1100 and a buffer material layer 1200 provided on the base substrate 1100.

The base substrate 1100 may include a transparent substrate such as a sapphire substrate (AlxOy) and/or a glass substrate. It is, however, to be understood that the present disclosure is not limited thereto. The base substrate 1100 may include a conductive substrate such as GaN, SiC, ZnO, Si, GaP and/or GaAs. In one or more embodiments, the base substrate 1100 may be a sapphire substrate (AlxOy).

The buffer material layer 1200 may be formed on one surface (e.g., an upper surface) of the base substrate 1100. The buffer material layer 1200 can reduce a lattice constant difference between the base substrate 1100 and a first semiconductor material layer 3100 formed thereon.

For example, the buffer material layer 1200 may include an undoped semiconductor. The buffer material layer 1200 may include substantially the same material as the first semiconductor material layer 3100, which may not be doped with either n-type or p-type, or which may have a doping concentration smaller than that of the first semiconductor material layer 3100. In one or more embodiments, the buffer material layer 1200 may be, but is not limited to, at least one of InAlGaN, GaN, AlGaN, InGaN, AlN or InN.

Figure 8:
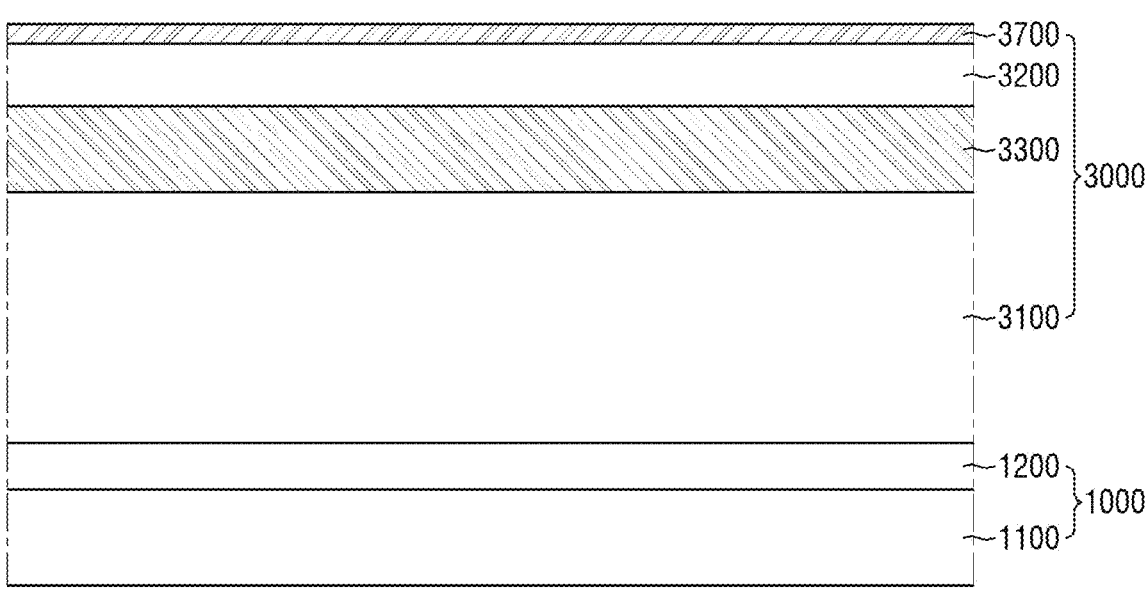
Figure 8:
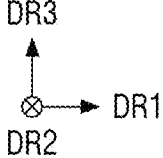

Subsequently, referring to FIG. 8, a first stack structure 3000 is formed on the lower substrate 1000. In one or more embodiments, the first stacked structure is formed on the lower substrate 1000, in which the first semiconductor material layer 3100, an emission material layer 3300, a second semiconductor material layer 3200 and an electrode material layer 3700 are sequentially stacked on one another.

The plurality of semiconductor material layers grown by an epitaxial process may be formed by growing a seed crystal. The method of forming the semiconductor material layers may include an electron beam deposition method, physical vapor deposition (PVD), chemical vapor deposition (CVD), plasma laser deposition (PLD), dual-type thermal evaporation, sputtering, metal-organic chemical vapor deposition (MOCVD), etc. For example, the method may be carried out by metal-organic chemical vapor deposition (MOCVD). It is, however, to be understood that the present disclosure is not limited thereto.

A precursor material for forming the semiconductor material layers is not particularly limited and any suitable material in the art may be selected as long as it can form a target material. For example, the precursor material may include a metal precursor including an alkyl group such as a methyl group and/or an ethyl group. For example, like the light-emitting element ED according to the embodiments where the first semiconductor layer 31, the second semiconductor layer 32 and the emissive layer 33 include one or more of AlGaInN, GaN, AlGaN, InGaN, AlN or InN, the metal precursor may be trimethyl gallium (Ga(CH$_3$)$_3$), or a compound such as trimethyl aluminum (Al(CH$_3$)$_3$) and/or triethyl phosphate ((C$_2$H$_5$)$_3$PO$_4$). It is, however, to be understood that the present disclosure is not limited thereto. The plurality of semiconductor material layers may be formed via a deposition process using the metal precursor and a non-metal precursor.

A plurality of layers included in the first stack structure 3000 may correspond to the layers included in the core 30 according to the above embodiments, respectively. For example, the first semiconductor material layer 3100, the emission material layer 3300, the second semiconductor material layer 3200 and the electrode material layer 3700 of the first stack structure 3000 may correspond to the first semiconductor layer 31, the emissive layer 33, the second semiconductor layer 32 and the element electrode layer 37 of the core 30, respectively, and may include the same material as the materials of the layers, respectively.

Figure 9:
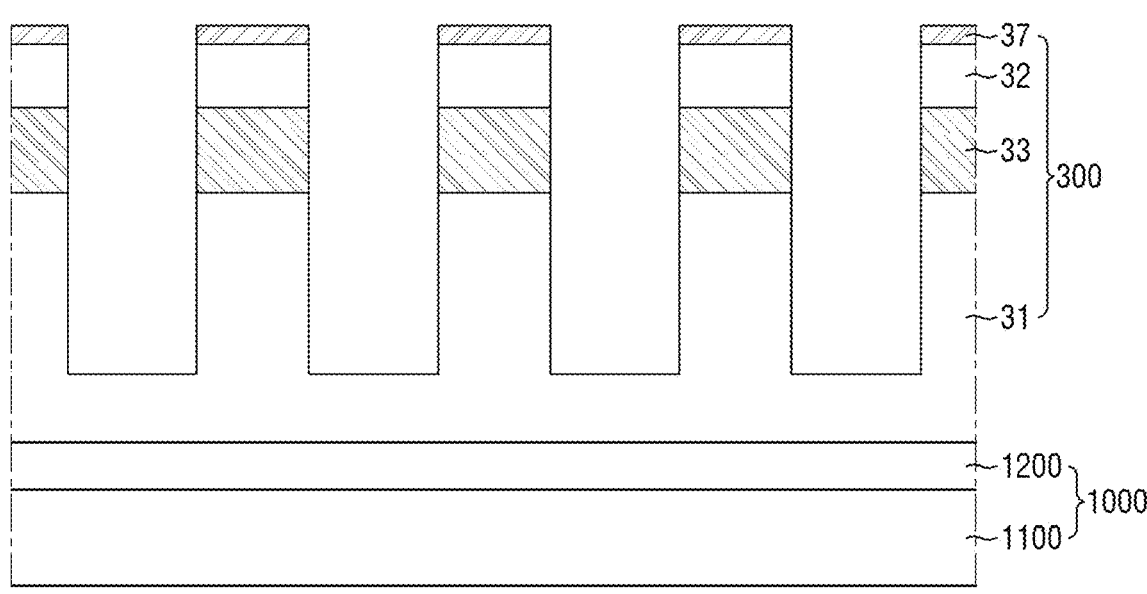
Figure 9:
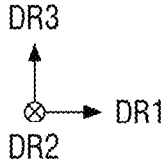
Figure 10:
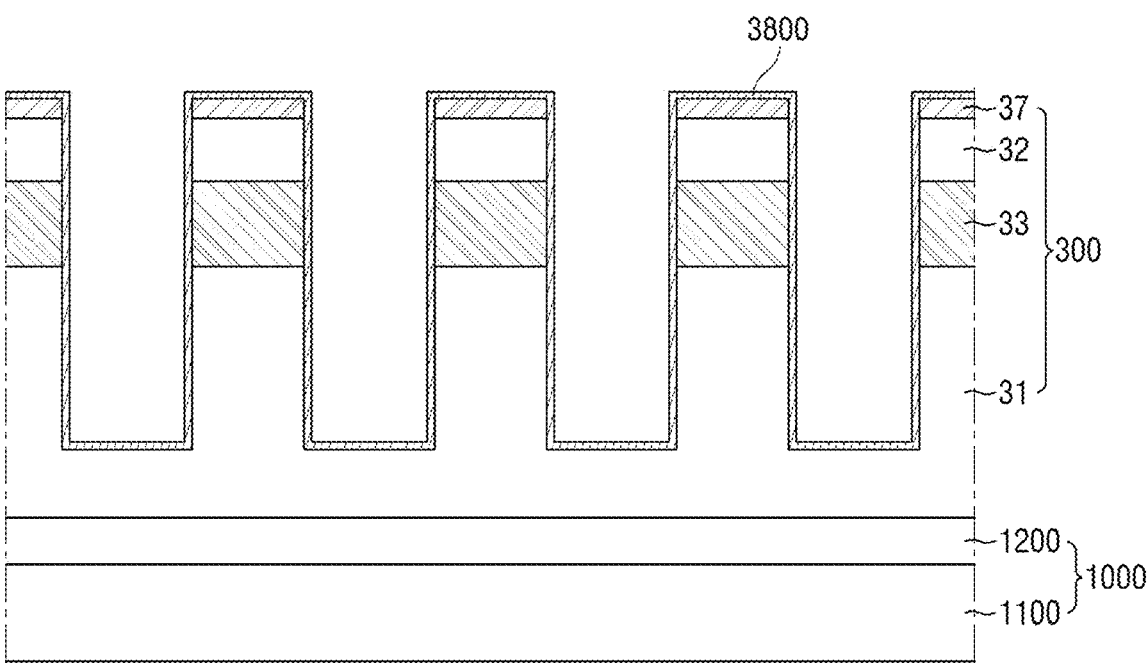
Figure 10:
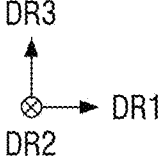

Subsequently, referring to FIG. 9, the first stack structure 3000 is etched to form a plurality of semiconductor rods 300 spaced apart from one another.

For example, the semiconductor rods 300 spaced apart from one another may be formed by etching the first stack structure 3000 in the direction perpendicular (or substantially perpendicular) to the upper surface of the lower substrate 1000, for example, in the third direction DR3. The first stack structure 3000 may be etched by a suitable patterning method. For example, the patterning method may be performed by forming an etch mask layer above the first stack structure 3000 and etching the first stack structure 3000 along the etch mask layer in the third direction DR3.

For example, the process of etching the first stack structure 3000 may include dry etching, wet etching, reactive ion etching (RIE), inductively-coupled-plasma reactive ion etching (ICP-RIE), etc. The dry etching allows for anisotropic etching, and thus it may be suitable for vertical etching. According to one or more embodiments of the present disclosure, the etching of the first stack structure 3000 may be performed by the combination of dry etching and wet etching. For example, dry etching may be carried out in the third direction DR3, and then the etched sidewall may be placed on the plane perpendicular (or substantially perpendicular) to the upper surface of the lower substrate 1000 by wet etching, which is isotropic etching. When any of the above-described dry etching methods is used, the etching etchant may be Cl$_2$ and/or O$_2$. It is, however, to be understood that the present disclosure is not limited thereto.

A plurality of semiconductor rods 300 spaced apart from one another may be formed on the lower substrate 1000 by the above-described etching process. Each of the semiconductor rods 300 may include a first semiconductor layer 31, an emissive layer 33, a second semiconductor layer 32 and an element electrode layer 37. In the etching process, the lower end of the first semiconductor material layer 3100 may not be completely etched, but there may be a residual layer. The first semiconductor layers 31 of the plurality of semiconductor rods 300 may be connected with one another through the first semiconductor material layer 3100. The semiconductor rods 300 may be separated from the first semiconductor material layer 3100 in a subsequent process to form the cores 30.

Figure 11:
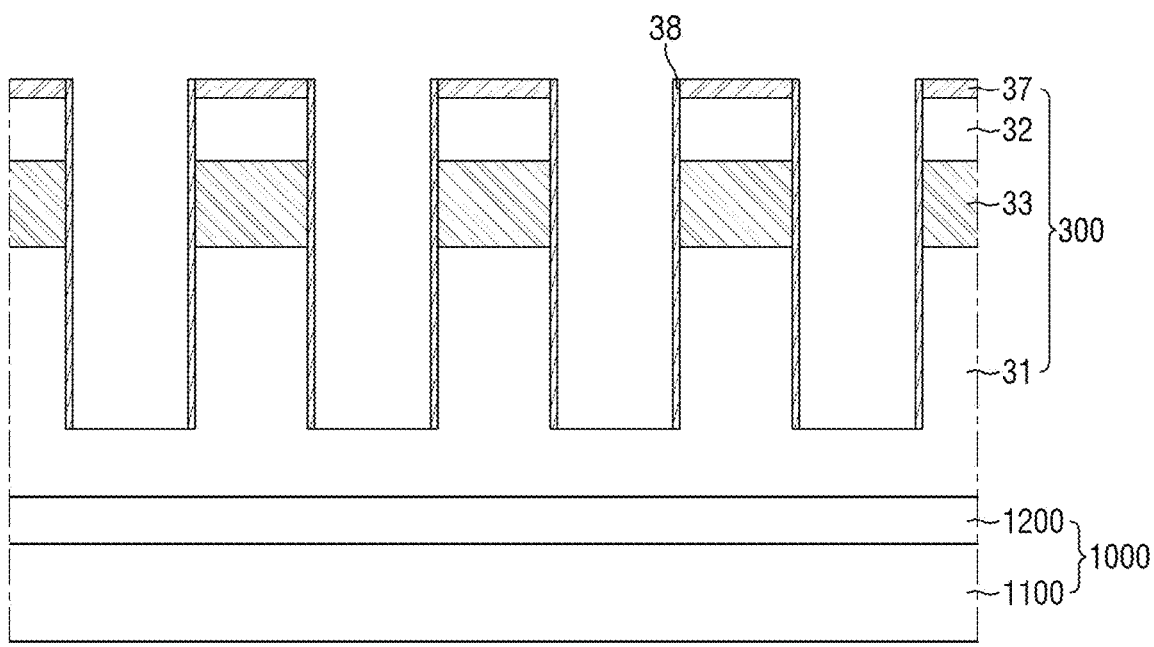
Figure 11:
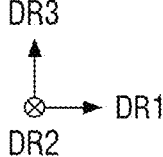

Subsequently, referring to FIGS. 11 and 12, a first insulating material layer 3800 is formed on the plurality of semiconductor rods 300. The first insulating material layer 3800 may be formed to surround the outer surface of the semiconductor rods 300, and then an etching process is carried out to partially remove the first insulating material layer 3800 to expose the upper surfaces of the semiconductor rods 300, to form a first element insulating film 38.

The first insulating material layer 3800 may be formed on the entire surface of the lower substrate 1000, and thus it may be formed not only on the outer surface of the semiconductor rods 300 but also on the remaining first semiconductor material layer 3100 exposed between the semiconductor rods 300 spaced apart from one another. The outer surface of each of the semiconductor rods 300 may include the upper surface and the side surface. The first insulating material layer 3800 may be provided directly on the upper surface and the side surface of each of the semiconductor rods 300. Accordingly, the first insulating material layer 3800 may be provided directly on side surfaces of the plurality of semiconductor layers of the semiconductor rods 300 to be in contact with them.

The first insulating material layer 3800 may be formed by atomic layer deposition (ALD). The atomic layer deposition (ALD) may include a thermal atomic layer deposition (ALD), a plasma enhanced ALD (PEALD), etc. It should be noted that the deposition method of the first insulating material layer 3800 is not limited thereto. Wet deposition that gradually deposits the first insulating material layer 3800 on the semiconductor rods 300 using a solvent or dry deposition using a gas may also be used.

The first insulating material layer 3800 may become the above-described first element insulating film 38 of the light-emitting element ED via a subsequent process. Accordingly, the first insulating material layer 3800 may include the material included in the first element insulating film 38, for example, the composite of the insulating member 381 and the elastic member 382. For example, the insulating member 381 of the first insulating material layer 3800 may include an insulating material having a smaller elastic modulus than the elastic member 382. The insulating member 381 may include amorphous silicon oxide (SiO$_2$) and/or amorphous aluminum oxide (Al$_2$O$_3$). The elastic member 382 of the first insulating material layer 3800 may include an insulating material having a larger elastic modulus than the insulating member 381. The elastic member 382 may include a polymer material including carbon and/or a crystalline insulating material. For example, when the elastic member 382 is made of a polymer material, the elastic member 382 may include graphene and/or carbon nanotubes. When the elastic member 382 is made of a crystalline insulating material, it may include hafnium oxide (HfO$_2$) and/or zirconium oxide (ZrO$_2$) having an elastic modulus of 150 GPa or more.

The first insulating material layer 3800 may include the elastic member 382 in order to prevent or reduce cracks generated on the cut surface of the light-emitting element ED from propagating unevenly to the first semiconductor layer 31, and to reduce a height difference of the lower surface of the first semiconductor layer 31.

Subsequently, the process of partially removing the first insulating material layer 3800 may be carried out by dry etching process or etch-back, which is anisotropic etching. In the drawings (see FIG. 11), the upper surface of the first insulating material layer 3800 is removed to expose the element electrode layer 37, and in doing so, the element electrode layer 37 may also be partially etched. The thickness of the element electrode layer 37 of the core 30 of the light-emitting element ED thus fabricated may be smaller than the thickness of the electrode material layer 3700 formed during the fabrication process. The first insulating material layer 3800 formed on the remaining first semiconductor material layer 3100 between the semiconductor rods 300 may also be removed, and the upper surface of the remaining first semiconductor material layer 3100 may be exposed.

Although the upper surface of the element electrode layer 37 is partially exposed and the upper surface of the first insulating material layer 3800 is flat (or substantially flat) in the drawings, the present disclosure is not limited thereto. In some embodiments, the outer surface of the first insulating material layer 3800 may be partially curved where it surrounds the element electrode layer 37. In the process of partially removing the first insulating material layer 3800, the side surface as well as the upper surface of the first insulating material layer 3800 is partially removed, so that the end surface of the first insulating material layers 3800 surrounding the plurality of layers may be partially etched. As the upper surface of the first insulating material layer 3800 is removed, the outer surface of the first element insulating film 38 adjacent to the element electrode layer 37 is partially removed in the light-emitting element ED.

Lastly, as shown in FIGS. 12 and 13, the semiconductor rods 300 on which the first element insulating film 38 is formed are separated from the remaining first semiconductor material layer 3100. The semiconductor rods 300 separated from the lower substrate 1000 may become the light-emitting elements ED, each including the core 30 and the first element insulating film 38. The separation process of the plurality of semiconductor rods 300 may be carried out by a physical separation method and/or a chemical separation method.

According to the embodiments of the present disclosure, in the process of separating the lower surface of the first semiconductor layer 31 of each of the semiconductor rods 300 from the remaining first semiconductor material layer 3100, an abnormal profile of the lower surface or the unevenness of the lower surface of the first semiconductor layer 31 can be addressed.

Referring to FIG. 13, an external stress may be applied to the lower surface of the first semiconductor layer 31 to separate the semiconductor rods 300 from the first semiconductor material layer 3100. Cracks may occur by external stress in the first element insulating film 38 surrounding the lower portion of the first semiconductor layer 31. If cracks generated in the first element insulating film 38 propagate unevenly, the lower surface of the first semiconductor layer 31 that is the cut surface of the light-emitting element ED may have a height difference of 300 nm or more. If light-emitting elements having such a height difference are aligned in the display device 10 (see FIG. 22), the contact with connection electrodes 700 (see FIG. 22) may be poor, which lowers the light-emitting efficiency of the display device 10. As used herein, the expression "cracks propagate evenly (or substantially evenly)" may mean that the cracks progress in the direction parallel (or substantially parallel) to the direction in which the lower substrate 1000 is extended. On the other hand, the expression "cracks propagate unevenly" may mean that the cracks progress in directions obliquely to the direction in which the lower substrate 1000 is extended.

When the first element insulating film 38 includes the elastic member 382, seeds of cracks due to external stress are nucleated from the elastic member 382 (e.g., concentrated in or around the elastic member 382), and the cracks thus nucleated may propagate along the elastic member 382. Accordingly, in some embodiments, an amount of cracking in the first semiconductor layer 31 may be reduced. For example, in some embodiments, an amount of cracking in the elastic member 382 may be greater than that in the first semiconductor layer 31. In some embodiments, the cracks may be primarily, or even only, in the elastic member 382. For example, in some embodiments, the first semiconductor layer 31 may be substantially free, or even completely free, of cracks. Because the cracks propagate evenly (or substantially evenly) along the elastic member 382, the first semiconductor layer 31 surrounded by the first element insulating film 38 can be evenly (or substantially evenly) separated from the first semiconductor material layer 3100. Accordingly, the lower surface of the first semiconductor layer 31 that is the cut surface of the light-emitting element ED can have a flat (or substantially flat) surface with a height difference of 300 nm or less. Accordingly, when the light-emitting element ED having the reduced height difference of the lower surface of the first semiconductor layer 31 is aligned in the display device 10, it is possible to prevent or reduce disconnection with the connection electrodes 700 due to poor contact, and it is possible to improve the light-emitting efficiency of the display device 10.

FIGS. 14 to 16 are cross-sectional views showing processing steps of a method of fabricating light-emitting elements according to FIG. 4. FIG. 17 is an enlarged view conceptually depicting the first element insulating film according to the separation process of FIG. 16.

FIGS. 14 to 17 are cross-sectional views showing some of processing steps of a method of fabricating the light-emitting element ED_2 of FIG. 6.

Referring to FIGS. 14 and 15, a first insulating material layer 3800, a second insulating material layer 3910 and a third insulating material layer 3920 are formed on a semiconductor rod 300_2 including a first semiconductor layer 31, a second semiconductor layer 32, an emissive layer 33 and an element electrode layer 37. After the first insulating material layer 3800, the second insulating material layer 3910 and the third insulating material layer 3920 are formed to surround the outer surface of the semiconductor rod 300_2, an etching process is carried out to partially remove the first insulating material layer 3800, the second insulating material layer 3910 and the third insulating material layer 3920 so that the upper surface of the semiconductor rod 300_2 is exposed, such that a first element insulating film 38_3, a second element insulating film 391 and a third element insulating film 392 may be formed.

Referring to FIGS. 16 and 17, the plurality of semiconductor rods 300_2 on which the first element insulating film 38_3, the second element insulating film 391 and the third element insulating film 392 are formed is separated from the remaining first semiconductor material layer 3100, so that light-emitting elements ED_2 are formed.

The light-emitting elements ED_2 may include the first element insulating film 38_3 including a crystalline insulating material with an elastic modulus of 150 GPa or more, so that seeds of cracks due to external stress may be nucleated from (e.g., concentrated in) the elastic member 382 and may propagate along the elastic member 382. Because the cracks propagate evenly (or substantially evenly) along the elastic member 382, the first semiconductor layer 31 surrounded by the first element insulating film 38 can be evenly (or substantially evenly) separated from the first semiconductor material layer 3100. Accordingly, the lower surface of the first semiconductor layer 31 that is the cut surface of the light-emitting element ED can have a flat (or substantially flat) surface with a height difference of 300 nm or less. Accordingly, when the light-emitting element ED having the reduced height difference of the lower surface of the first semiconductor layer 31 is aligned in the display device 10, it is possible to prevent or reduce disconnection with the connection electrodes 700 due to poor contact, and it is possible to improve the light-emitting efficiency of the display device 10.

FIGS. 18A and 18B show images of light-emitting elements according to one or more embodiments of the present disclosure and light-emitting elements according to Comparative Example. FIG. 18A is an image of the second ends EP2 of the light-emitting elements according to Comparative Example, and FIG. 18B is an image of the second ends EP2 of the light-emitting elements ED according to the embodiments of the present disclosure.

Referring to FIG. 18A, the second ends EP2 that are the cut surfaces of the light-emitting elements may have an abnormal profile including a height difference of 300 nm or more. In contrast, referring to FIG. 18B, each of the light-emitting elements ED according to this embodiments includes the first element insulating film 38, so that the second ends EP2 can have a height difference of 300 nm or less and thus can have a flat (or substantially flat) surface.

FIG. 19 is a plan view of a display device according to one or more embodiments of the present disclosure.

Referring to FIG. 19, a display device 10 may display a moving image and/or a still image. A display device 10 may refer to any suitable electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, and/or a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, a display panel including the above-described light-emitting element ED, for example, an inorganic light-emitting diode, is employed as an example of the display panel, but the present disclosure is not limited thereto. Any other suitable display panel may be employed as long as the technical idea of the present disclosure can be equally applied.

A fourth direction DR4, a fifth direction DR5 and a sixth direction DR6 are defined in the drawings. The display device 10 according to the embodiment of the present disclosure will be described with reference to the drawings. The fourth direction DR4 and the fifth direction DR5 may be perpendicular (or substantially perpendicular) to each other in one plane. The sixth direction DR6 may be perpendicular (or substantially perpendicular) to the plane in which the fourth and fifth directions DR4 and DR5 are located. The sixth direction DR6 is perpendicular (or substantially perpendicular) to each of the fourth direction DR4 and the fifth direction DR5. In the following description of the display devices 10 according to the embodiments of the present disclosure, the sixth direction DR6 refers to the thickness direction of the display device 10.

The display device 10 may have a rectangular shape including longer sides in the fourth direction DR4 and shorter sides in the fifth direction DR5 when viewed from the top. Although the corners where the longer sides and the shorter sides of the display device 10 meet may form a right angle, this is merely illustrative. The display device 1 may have rounded corners. The shape of the display device 10 when viewed from the top is not limited to that shown. The display device 10 may have other suitable shapes such as a square, a rectangle with rounded corners (vertices), other polygons and/or a circle.

A display surface may be located on one side of the display device 10 in the sixth direction DR6, i.e., the thickness direction. In the following description, the upper side of the display device 10 refers to the one side in the sixth direction DR6 where images are displayed, and the upper surface of the display device 10 refers to the surface facing the one side in the sixth direction DR6, unless stated otherwise. In addition, the lower portion refers to the opposite side in the sixth direction DR6, and the lower surface refers to a surface facing the opposite side in the sixth direction DR6.

As used herein, the fourth direction DR4 may be parallel (or substantially parallel) to the longitudinal direction (or the extension direction) of the light-emitting element ED or the third direction DR3. In one or more embodiments, the light-emitting element ED extended in the third direction DR3 may be aligned in parallel (or substantially in parallel) to the fourth direction DR4 of the display device 10.

The display device 10 may include a display area DPA and a non-display area NDA. In the display area DPA, images can be displayed. In the non-display area NDA, images are not displayed.

The shape of the display area DPA may follow the shape of the display device 10. For example, the shape of the display area DPA may have a rectangular shape generally similar to the shape of the display device 10 when viewed from the top. The display area DPA may generally occupy the majority of the center portion of the display device 10.

The display area DPA may include a plurality of pixels PX. The plurality of pixels PX may be arranged in a matrix. The shape of each of the pixels PX may be rectangular or square when viewed from the top. It is, however, to be understood that the present disclosure is not limited thereto. The shape of each of the pixels PX may have a diamond shape having the sides inclined with respect to one direction. The pixels PX may be arranged in stripes or the PENTILE® pattern (PENTILE® is a registered trademark owned by Samsung Display Co., Ltd.) alternately with each other.

The non-display area NDA may be provided around the display area DPA. The non-display area NDA may surround the display area DPA entirely or partially. According to one or more embodiments of the present disclosure, the display area DPA may have a rectangular shape, and the non-display areas NDA may be provided to be adjacent to the four sides of the display area DPA. The non-display area NDA may form the bezel of the display device 10. Lines, circuit drivers included in the display device 10, and/or pad areas on which external devices are to be mounted may be provided in the non-display areas NDA.

FIG. 20 is a plan view showing a layout of a pixel of a display device according to one or more embodiments of the present disclosure. FIG. 21 is a cross-sectional view showing an example cross-section taken along line I-I' of FIG. 20.

FIG. 20 shows a layout of a first electrode 210 and a second electrode 220, first banks 400: 410 and 420, a second bank 600, a plurality of light-emitting elements ED, and connection electrodes 700: 710 and 720 provided in a pixel PX of a display device 10 when viewed from the top.

Referring to FIG. 20, each pixel PX of the display device 10 may include an emission area EMA and a non-emission area. In the emission area EMA, light emitted from the light-emitting elements ED may exit. In the non-emission area, light emitted from the light-emitting elements ED do not reach and thus no light exits therefrom.

The emission area EMA may include an area where the light-emitting elements ED are provided, and an area adjacent to it. In addition, the emission area may further include an area in which light emitted from the light-emitting elements ED is reflected and/or refracted by other elements to exit.

Each pixel PX may further include a subsidiary area SA provided in the non-emission area. No light-emitting elements ED may be provided in the subsidiary area SA. The subsidiary area SA may be provided on the upper side of the emission area EMA in a pixel PX when viewed from the top. The subsidiary area SA may be provided between the emission areas EMA of neighboring pixels PX in the fifth direction DR5. The subsidiary area SA may include regions in which the electrode layer 200 and the connection electrodes 700 are electrically connected through contacts CT1 and CT2.

The subsidiary area SA may include a separation region ROP. In the separation region ROP of the subsidiary area SA, a first electrode 210 and a second electrode 220 included in the electrode layer 200 of a pixel PX may be separated from those of another pixel PX adjacent to the pixel PX in the fifth direction DR5, respectively. Referring to FIGS. 20 and 21, the display device 10 may include a substrate SUB, a circuit element layer provided on the substrate SUB, and an emission material layer provided on the circuit element layer.

The substrate SUB may be an insulating substrate. The substrate SUB may be made of an insulating material such as glass, quartz and/or a polymer resin. The substrate SUB may be either a rigid substrate or a flexible substrate that can be bent, folded, and/or rolled.

The circuit element layer may be provided on the substrate SUB. The circuit element layer may include a lower metal layer 110, a semiconductor layer 120, a first conductive layer 130, a second conductive layer 140, a third conductive layer 150 and a plurality of insulating layers.

The lower metal layer 110 is provided on the substrate SUB. The lower metal layer 110 may include a light-blocking pattern BML. The light-blocking pattern BML may be provided at least under a channel region of an active layer ACT of a transistor TR to cover it. It is, however, to be understood that the present disclosure is not limited thereto. In some embodiments, the light-blocking pattern BML may not be provided.

The lower metal layer 110 may include a material that blocks or reduces light. For example, the lower metal layer 110 may be made of an opaque metal material that blocks or reduces light transmission.

The buffer layer 161 may be provided over the bottom metal layer 110. The buffer layer 161 may be provided to cover the entire surface of the substrate SUB on which the bottom metal layer 110 is provided. The buffer layer 161 can protect a plurality of transistors from moisture permeating through the substrate SUB which is vulnerable to moisture permeation.

The semiconductor layer 120 is provided on the buffer layer 161. The semiconductor layer 120 may include the active layer ACT of the transistor TR. The active layer ACT of the transistor TR may be provided to overlap the light-blocking pattern BML of the lower metal layer 110 as described above.

The semiconductor layer 120 may include polycrystalline silicon, monocrystalline silicon, an oxide semiconductor, etc. According to one or more embodiments of the present disclosure, when the semiconductor layer 120 includes polycrystalline silicon, the polycrystalline silicon may be formed by crystallizing amorphous silicon. When the semiconductor layer 120 contains polycrystalline silicon, the active layer ACT of the transistor TR may include a plurality of doped regions doped with impurities, and a channel region between them. In some embodiments, the semiconductor layer 120 may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

The gate insulator 162 may be provided on the semiconductor layer 120. The gate insulator 162 may work as a gate insulating layer of a transistor. The gate insulator 162 may be made up of multiple (e.g., a plurality of) layers in which inorganic layers including inorganic material, e.g., at least one of silicon oxide (SiOx), silicon nitride (SiNx) or silicon oxynitride (SiOxNy) are stacked on one another alternately with each other.

The first conductive layer 130 may be provided on the gate insulator 162. The first conductive layer 130 may include the gate electrode GE of the transistor TR. The gate electrode GE may be provided so that it overlaps the channel region of the active layer ACT in the thickness direction of the substrate SUB, e.g., in the sixth direction DR6.

A first interlayer dielectric layer 163 may be provided on the first conductive layer 130. The first interlayer dielectric layer 163 may cover the gate electrode GE. The first interlayer dielectric layer 163 may serve as an insulating layer between the first conductive layer 130 and other layers provided thereon and can protect the first conductive layer 130.

The second conductive layer 140 may be provided on the first interlayer dielectric layer 163. The second conductive layer 140 may include a drain electrode SD1 of the transistor TR and a source electrode SD2 of the transistor TR.

The drain electrode SD1 and the source electrode SD2 of the transistor TR may be electrically connected (e.g., electrically coupled) to both end regions of the active layer ACT of the transistor TR through contact holes penetrating the first interlayer dielectric layer 163 and the gate insulator 162, respectively. In some embodiments, the source electrode SD2 of the transistor TR may be electrically connected to the light-blocking pattern BML of the lower metal layer 110 through another contact hole penetrating through the first interlayer dielectric layer 163, the gate insulator 162, and the buffer layer 161.

A second interlayer dielectric layer 164 may be provided on the second conductive layer 140. The second interlayer dielectric layer 164 may be provided to cover the drain electrode SD1 of the transistor TR and the source electrode SD2 of the transistor TR. The second interlayer dielectric layer 164 may serve as an insulating layer between the second conductive layer 140 and other layers provided thereon and can protect the second conductive layer 140.

The third conductive layer 150 may be provided on the second interlayer dielectric layer 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction of the substrate SUB. A high-level voltage (or first supply voltage) supplied to the transistor TR may be applied to the first voltage line VL1.

The second voltage line VL2 may be electrically connected to the second electrode 220 through a second electrode contact hole CTS penetrating through a via layer 166 and a passivation layer 165 to be described herein below. A low-level voltage (or second supply voltage), which is lower than the high-level voltage supplied to the first voltage line VL1, may be applied to the second voltage line VL2. For example, the high-level voltage (or first supply voltage) to be supplied to the transistor TR may be applied to the first voltage line VL1, and the low-level voltage (or second supply voltage) which is lower than the high-level voltage supplied to the first voltage line VL1 may be applied to the second voltage line VL2.

The conductive pattern CDP may be electrically connected to the source electrode SD2 of the transistor TR. The conductive pattern CDP may be electrically connected to the source electrode SD2 of the transistor TR through a contact hole penetrating the second interlayer dielectric layer 164. In one or more embodiments, the conductive pattern CDP may be electrically connected to the first electrode 210 through a first electrode contact hole CTD penetrating the via layer 166 and the passivation layer 165 to be described herein below. The transistor TR may transmit the first supply voltage applied from the first voltage line VL1 to the first electrode 210 through the conductive pattern CDP.

The passivation layer 165 may be provided on the third conductive layer 150. The passivation layer 165 may be provided to cover the third conductive layer 150. The passivation layer 165 may serve to protect the third conductive layer 150.

The buffer layer 161, the gate insulator 162, the first interlayer dielectric layer 163, the second interlayer dielectric layer 164 and the passivation layer 165 may each independently be made up of multiple inorganic layers stacked on one another alternately. For example, the buffer layer 161, the gate insulator 162, the first interlayer dielectric layer 163, the second interlayer dielectric layer 164 and/or the passivation layer 165 may be made up of a double layer in which inorganic layers including at least one of silicon oxide (SiOx), silicon nitride (SiNx) or silicon oxynitride (SiON) are stacked on one another, or may be made up of multiple layers in which the inorganic layers are alternately stacked on one another. It is, however, to be understood that the present disclosure is not limited thereto. The buffer layer 161, the gate insulator 162, the first interlayer dielectric layer 163, the second interlayer dielectric layer 164 and/or the passivation layer 165 may be made up of a single inorganic layer including the above-described insulating material.

The via layer 166 may be provided on the passivation layer 165. The via layer 166 may include an organic insulating material, for example, an organic material such as polyimide (PI). The via layer 166 may provide a flat (or substantially flat) surface. Accordingly, the upper surface (or surface) of the via layer 166 on which the light-emitting element layer to be described herein below is provided may have a generally flat (or substantially flat) surface regardless of whether there is a pattern thereunder or the shape of the pattern if any.

The emission material layer may be provided on the circuit element layer. The emission material layer may be provided on the via layer 166. The emission material layer may include a first bank 400, electrode layers 200: 210 and 220, a first insulating layer 510, a second bank 600, a plurality of light-emitting elements ED and connection electrodes 700: 710 and 720.

The first bank 400 may be provided on the via layer 166 in the emission area EMA. The first bank 400 may be provided directly on a surface of the via layer 166. At least a portion of the first bank 400 may protrude upward from the surface of the via layer 166 (e.g., toward one side in the sixth direction DR6). The protruding portion of the first bank 400 may have inclined side surfaces. As the first bank 400 includes the inclined side surfaces, the light that is emitted from the light-emitting elements ED and travels toward the side surfaces of the first bank 400 can be guided toward the upper side (e.g., display side).

The first bank 400 may include a first sub-bank 410 and a second sub-bank 420 spaced apart from each other. The first sub-bank 420 and the second sub-bank 420 spaced apart from each other may provide the space where the light-emitting elements ED are provided and may also work as reflective partition walls that change the traveling direction of light emitted from the light-emitting elements ED toward the display side.

Although the side surfaces of the first bank 400 have an inclined linear shape in the drawings, the present disclosure is not limited thereto. For example, the side surfaces (or outer surfaces) of the first bank 400 may have a rounded shape such as semi-circle and/or semi-ellipse. According to one or more embodiments of the present disclosure, the first bank 400 may include, but is not limited to, an organic insulating material such as polyimide (PI).

The electrode layers 200 have a shape extended in one direction and may be provided to traverse the emission area EMA and the subsidiary area SA. The electrode layer 200 may transmit an electric signal applied from the circuit element layer to the light-emitting elements ED to emit light. In some embodiments, the electrode layer 200 may also be utilized to generate an electric field used in a process of aligning the plurality of light-emitting elements ED.

The electrode layer 200 may be provided on the first bank 400 and the via layer 166 exposed by the first bank 400. The electrode layers 200 may be provided on the first bank 400 in the emission area EMA, and may be provided on the via layer 200 exposed by the first bank 400 in the non-emission area.

The electrode layer 200 may include a first electrode 210 and a second electrode 220. The first electrode 210 and the second electrode 220 may be spaced apart from each other.

The first electrode 210 may be provided on the left-hand side in each pixel PX when viewed from the top (e.g., in a plan view). The first electrode 210 may have a shape extended in the fifth direction DR5 when viewed from the top. The first electrode 210 may be provided such that it passes through the emission area EMA and the subsidiary area SA. The first electrode 210 may be extended in the fifth direction DR5 when viewed from the top, and may be separated from the first electrode 210 of another pixel PX adjacent to it in the fifth direction DR5 at the separation region ROP of the subsidiary area SA.

The second electrode 220 may be spaced apart from the first electrode 210 in the fourth direction DR4. The second electrode 220 may be provided on one side of each pixel PX in the fourth direction DR4, e.g., on the right side when viewed from the top (e.g., in a plan view). The second electrode 220 may have a shape extended in the fifth direction DR5 when viewed from the top. The second electrode 220 may be provided such that it passes through the emission area EMA and the subsidiary area SA. The second electrode 220 may be extended in the fifth direction DR5 when viewed from the top, and may be separated from the second electrode 220 of another pixel PX adjacent to it in the fifth direction DR5 at the separation region ROP of the subsidiary area SA.

For example, in the emission area EMA, the first electrode 210 may be provided on the first sub-bank 410, and the second electrode 220 may be provided on the second sub-bank 420. The first electrode 210 may be extended outward from (e.g., beyond) the first sub-bank 410 and may also be provided on the via layer 166 exposed by the first sub-bank 410. Likewise, the second electrode 220 may be extended outward from (e.g., beyond) the second sub-bank 420 and may also be provided on the via layer 166 exposed by the second sub-bank 420. The first electrode 210 and the second electrode 220 may be spaced apart from each other between the first sub-bank 410 and the second sub-bank 420. The via layer 166 may be exposed between the first electrode 210 and the second electrode 220 spaced apart from each other.

The first electrode 210 may be spaced apart from the first electrode 210 of another pixel PX adjacent thereto in the fifth direction DR5 with the separation region ROP therebetween in the subsidiary area SA. Likewise, the second electrode 220 may be spaced apart from the second electrode 220 of another pixel PX adjacent thereto in the fifth direction DR5 with the separation region ROP therebetween in the subsidiary area SA. Accordingly, the first electrode 210 and the second electrode 220 may expose the via layer 166 at the separation region ROP of the subsidiary area SA.

The first electrode 210 may be electrically connected (e.g., electrically coupled) to the conductive pattern CDP of the circuit element layer through the first electrode contact hole CTD penetrating the via layer 166 and the passivation layer 165. For example, the first electrode 210 may be in contact with the upper surface of the conductive pattern CDP exposed by the first electrode contact hole CTD. The first supply voltage applied from the first voltage line VL1 may be transmitted to the first electrode 210 through the conductive pattern CDP.

The second electrode 220 may be electrically connected to the second voltage line VL2 of the circuit element layer through the second electrode contact hole CTS penetrating the via layer 166 and the passivation layer 165. For example, the second electrode 220 may be in contact with the upper surface of the second voltage line VL2 exposed by the second electrode contact hole CTS. The second supply voltage applied from the second voltage line VL2 may be delivered to the second electrode 220.

The electrode layer 200 may include a conductive material having high or suitable reflectance. For example, the electrode layer 200 may include a metal such as silver (Ag), copper (Cu) and/or aluminum (Al) as the material having high or suitable reflectance, and may include an alloy including aluminum (Al), nickel (Ni), lanthanum (La), etc. The electrode layer 200 may reflect light that is emitted from the light-emitting elements ED and travels toward the side surfaces of the first bank 400 toward the upper side of each of the pixels PX.

It is, however, to be understood that the present disclosure is not limited thereto. The electrode layer 200 may further include a transparent conductive material. For example, the electrode layer 200 may include a material such as ITO, IZO and/or ITZO. In some embodiments, the electrode layer 200 may have a structure in which one or more layers of a transparent conductive material and a metal layer having high reflectance are stacked on one another, or may be made up of a single layer including them. For example, the electrode layer 200 may have a stack structure such as ITO/Ag/ITO/, ITO/Ag/IZO, and/or ITO/Ag/ITZO/IZO.

The first insulating layer 510 may be provided on the via layer 166 on which the electrode layers 200 are formed. The first insulating layer 510 can protect the electrode layers 200, and can insulate the first electrode 210 and the second electrode 220 from each other.

The first insulating layer 510 may include an inorganic insulating material. For example, the first insulating layer 510 may include at least one of an inorganic insulating material such as silicon oxide (SiOx), silicon nitride (SiNx), silicon oxynitride (SiOxNy), aluminum oxide (AlxOy) and/or aluminum nitride (AlN). The first insulating layer 510 made of an inorganic material may have a surface shape conforming to the pattern shape of the electrode layers 200 thereunder. For example, the first insulating layer 510 may have a stair-like shape according to the shape of the electrode layers 200 provided under the first insulating layer 510. In one or more embodiments, a portion of the upper surface of the first insulating layer 510 may be depressed between the first electrode 210 and the second electrode 220 spaced apart from each other. Accordingly, the height of the upper surface of the first insulating layer 510 (e.g., as measured from the upper surface of the via layer 166) provided on the first electrode 210 and the second electrode 220 may be larger than the height of the upper surface of the first insulating layer 510 (e.g., as measured from the upper surface of the via layer 166) provided on the via layer 166 where the first electrode 210 and the second electrode 220 are not provided. Herein, heights of different portions of a layer may be compared with each other based on the heights measured from a flat reference surface where no structure is provided thereunder (e.g., from the upper surface of the via layer 166).

The first insulating layer 510 may include a first contact CT1 exposing a portion of the upper surface of the first electrode 210, and a second contact CT2 exposing a portion of the upper surface of the second electrode 220 in the subsidiary area SA. The first electrode 210 may be electrically connected to a first connection electrode 710 to be described herein below through the first contact CT1 penetrating the first insulating layer 510 in the subsidiary area SA, and the second electrode 220 may be electrically connected to a second connection electrode 720 to be described herein below through the second contact CT2 penetrating the first insulating layer 510 in the subsidiary area SA.

The second bank 600 may be provided on the first insulating layer 510. The second bank 600 may be provided in a lattice pattern, including portions extended in the fourth direction DR4 and the fifth direction DR5 when viewed from the top (e.g., in a plan view).

The second bank 600 may be provided across the boundary of the pixels SPX to distinguish between neighboring pixels PX, and may distinguish the emission area EMA from the subsidiary area SA. In some embodiments, the second bank 600 has a height greater than that of the first bank 400. Accordingly, during an inkjet printing process for aligning the light-emitting elements ED of the process of fabricating the display device 10, it is possible to prevent or reduce the flow of the ink in which the plurality of light-emitting elements ED is dispersed into the adjacent pixel PX, and thus the ink can be ejected into the emission area EMA.

The plurality of light-emitting elements ED may be provided in the emission areas EMA. The plurality of light-emitting elements ED may not be provided in the subsidiary area SA.

The light-emitting elements ED may be provided on the first insulating layer 510 between the first sub-bank 410 and the second sub-bank 420. The light-emitting elements ED may be provided on the first insulating layer 510 between the first electrode 210 and the second electrode 220.

The light-emitting elements ED may have a shape extended in a direction (e.g., the forth direction DR4), and may be provided so that their both ends are placed on the first electrode 210 and the second electrode 220, respectively. For example, the plurality of light-emitting elements ED may be provided such that the first ends of the light-emitting elements ED are placed on the first electrode 210 while the second ends of the light-emitting elements ED are placed on the second electrode 220.

The length of each of the light-emitting elements ED in the longitudinal direction (i.e., the fourth direction DR4 in the drawings) may be smaller than the shortest distance between the first sub-bank 410 and the second sub-bank 420 spaced apart from each other in the fourth direction DR4. In addition, the length of each of the light-emitting elements ED may be greater than the shortest distance between the first electrode 210 and the second electrode 220 spaced apart from each other in the fourth direction DR4. The distance between the first sub-bank 410 and the second sub-bank 420 in the fourth direction DR4 is larger than the length of each of the light-emitting elements ED, and the distance between the first electrode 210 and the second electrode 220 in the fourth direction DR4 is smaller than the length of each of the light-emitting elements ED, so that the plurality of light-emitting elements ED may be provided such that their both ends are placed on the first electrode 210 and the second electrode 220 between the first sub-bank 410 and the second sub-bank 420, respectively.

The light-emitting elements ED may be spaced apart from one another along the fifth direction DR5 in which the first and second electrodes 210 and 220 are extended, and may be aligned substantially parallel to one another.

The second insulating layer 520 may be provided on the light-emitting elements ED. The second insulating layer 520 may be provided on the light-emitting elements ED to expose the both ends of the light-emitting elements ED. The second insulating layer 520 may be provided to partially surround the outer surfaces of the light-emitting elements ED so that the first ends and the second ends of the light-emitting elements ED are not covered.

The portion of the second insulating layer 520 which is provided on the light-emitting elements ED may be extended in the fifth direction DR5 on the first insulating layer 510 when viewed from the top, thereby forming a linear or island-like pattern in each pixel PX. The second insulating layer 520 can protect the light-emitting elements ED and fix the light-emitting elements ED during the process of fabricating the display device 10. In addition, the second insulating layer 520 may be provided to fill the space between light-emitting elements ED and the first insulating layer 510 thereunder.

The connection electrodes 700 may be provided on the second insulating layer 520. The connection electrodes 700 may be provided on the first insulating layer 510 on which the light-emitting elements ED are provided. The connection electrodes 700 may include a first connection electrode 710 and a second connection electrode 720 spaced apart from each other.

The first connection electrode 710 may be provided on the first electrode 210 in the emission area EMA. The first connection electrode 710 may have a shape extended in the fifth direction DR5 on the first electrode 210. The first connection electrode 710 may be in contact with the first electrode 210 and the first ends of the light-emitting elements ED.

The first connection electrode 710 may be in contact with the first electrode 210 exposed by the first contact CT1 penetrating through the first insulating layer 510 in the subsidiary area SA, and may be in contact with the first ends of the light-emitting elements ED in the emission area EMA. For example, the first connection electrode 710 may electrically connect the first electrode 210 with the first ends of the light-emitting elements ED.

The second connection electrode 720 may be provided on the second electrode 220 in the emission area EMA. The second connection electrode 720 may have a shape extended in the fifth direction DR5 on the second electrode 220. The second contact electrode 720 may be in contact with the second electrode 220 and the second ends of the light-emitting elements ED.

The second connection electrode 720 may be in contact with the second electrode 220 exposed by the second contact CT2 penetrating through the first insulating layer 510 in the subsidiary area SA, and may be in contact with the second ends of the light-emitting diodes ED in the emission area EMA. For example, the second connection electrode 720 may electrically connect the second electrode 220 with the second ends of the light-emitting elements ED.

The first connection electrode 710 and the second connection electrode 720 may be spaced apart from each other on the light-emitting elements ED. For example, the first connection electrode 710 and the second connection electrode 720 may be spaced apart from each other with the second insulating layer 520 therebetween. The first connection electrode 710 and the second connection electrode 720 may be electrically insulated from each other.

The first connection electrode 710 and the second connection electrode 720 may include the same material. For example, each of the first connection electrode 710 and the second connection electrode 720 may include a conductive material. For example, the first connection electrode 710 and the second connection electrode 720 may include ITO, IZO, ITZO, aluminum (Al), etc. For example, each of the first connection electrode 710 and the second connection electrode 720 may include a transparent conductive material. Because the first connection electrode 710 and the second connection electrode 720 each include a transparent conductive material, the light emitted from the light-emitting elements ED may pass through the first connection electrode 710 and the second connection electrode 720 to proceed toward the first electrode 210 and the second electrode 220, and may be reflected off the surfaces of the first electrode 210 and the second electrode 220.

The first connection electrode 710 and the second connection electrode 720 may include the same material and may be formed as the same layer. The first connection electrode 710 and the second connection electrode 720 may be formed together via the same process.

A third insulating layer 530 may be provided on the connection electrodes 700. The third insulating layer 530 may cover the emission material layer provided thereunder. The third insulating layer 530 may cover the first bank 400, the electrode layer 200, the first insulating layer 510, the plurality of light-emitting elements ED, and the connection electrodes 700. The third insulating layer 530 may be provided on the second bank 600 to cover the second bank 600 as well.

The third insulating layer 530 can protect the emission material layer provided thereunder from foreign substances such as moisture/oxygen and/or dust particles. The third insulating layer 530 can protect the first bank 400, the electrode layers 200, the first insulating layer 510, the plurality of light-emitting elements ED, and the connection electrodes 700.

FIG. 22 is an enlarged cross-sectional view showing an example of area A of FIG. 21.

Referring to FIG. 22, the light-emitting element ED may be provided such that the direction in which it is extended is parallel (or substantially parallel) to one surface of the substrate SUB. The plurality of semiconductor layers included in the light-emitting element ED may be arranged sequentially along the direction parallel (or substantially parallel) to the upper surface of the substrate SUB (or the upper surface of the via layer 166). For example, the first semiconductor layer 31, the emissive layer 33 and the second semiconductor layer 32 of the light-emitting element ED may be arranged sequentially parallel (or substantially parallel) to the upper surface of the substrate SUB.

For example, the first semiconductor layer 31, the emissive layer 33, the second semiconductor layer 32 and the element electrode layer 37 of the light-emitting element ED may be sequentially formed parallel (or substantially parallel) to the upper surface of the substrate SUB when viewed in the cross section traversing the both ends of the light-emitting element ED. As used herein, the direction parallel (or substantially parallel) to the upper surface of the substrate SUB refers to the fourth direction DR4 or the fifth direction DR5, and a plurality of semiconductor layers is sequentially provided along the fourth direction DR4 in the light-emitting element ED in the drawings.

The first end EP1 (see FIG. 2) of the light-emitting element ED may be located on the first electrode 210, while the second end EP2 (see FIG. 2) thereof may be located on the second electrode 220. It should be understood that the present disclosure is not limited thereto. The first end of the light-emitting element ED may be located on the second electrode 220, while the second end thereof may be located on the first electrode 210.

The second insulating layer 520 may be provided on the light-emitting elements ED. The second insulating layer 520 may be provided to surround (e.g., may be around) the outer surface of the light-emitting element ED. The second insulating layer 520 may be provided on the first element insulating film 38 of the light-emitting element ED, and may surround the outer surface of the first element insulating film 38 of the light-emitting element ED facing in the display direction DR6 (e.g., in the direction in which images are displayed).

The second insulating layer 520 may be provided to surround the outer surface of the light-emitting element ED (for example, the first element insulating film 38 of the light-emitting element ED) where the light-emitting element ED is provided, and the second insulating layer 520 may be provided on the first insulating layer 510 exposed by the light-emitting element ED where the light-emitting element ED is not provided.

The first connection electrode 710 may be in contact with a first end of the light-emitting element ED exposed by the second insulating layer 520. For example, the first connection electrode 710 may be provided to surround an end surface of the light-emitting element ED exposed by the second insulating layer 520. The first connection electrode 710 may be in contact with the element electrode layer 37 and the first element insulating film 38 surrounding the outer surface of the light-emitting element ED.

The second connection electrode 720 may be in contact with a second end of the light-emitting element ED exposed by the second insulating layer 520. For example, the second connection electrode 720 may be provided to surround the opposite end surface of the light-emitting element ED exposed by the second insulating layer 520. The second connection electrode 720 may be in contact with the first element insulating film 38 and the first semiconductor layer 31 of the light-emitting element ED.

The first connection electrode 710 and the second connection electrode 720 may be spaced apart from each other with the second insulating layer 520 therebetween. The first connection electrode 710 and the second connection electrode 720 may expose at least a portion of the upper surface of the second insulating layer 520.

According to these embodiments, the light-emitting efficiency of the display device 10 including the light-emitting elements ED can be improved. By way of comparison, as the height difference (or height variation) of the lower surface of the first semiconductor layer 31 of the light-emitting elements ED increases, it is more likely that the light-emitting elements ED are inclined toward one side or the light-emitting elements ED are disconnected from the connection electrodes 710 and 720. According to the present embodiments, the height difference of the lower surface of the first semiconductor layer 31 of the light-emitting elements ED can be reduced, so that the light-emitting elements ED can be aligned at the center between the first electrode 210 and the second electrode 220 when the light-emitting elements ED are aligned in the display device 10, and thus it is possible to prevent or reduce the disconnection from the connection electrodes 710 and 720 and to improve light-emitting efficiency of the display device 10.

FIG. 23 is an enlarged cross-sectional view showing another example of area A of FIG. 21.

Referring to FIG. 23, a light-emitting element ED_2 may be provided such that the direction in which it is extended is parallel (or substantially parallel) to one surface of the substrate SUB. The plurality of semiconductor layers included in the light-emitting element ED_2 may be arranged sequentially along the direction parallel (or substantially parallel) to the upper surface of the substrate SUB (or the upper surface of the via layer 166). For example, the first semiconductor layer 31, the emissive layer 33 and the second semiconductor layer 32 of the light-emitting element ED_2 may be arranged sequentially parallel (or substantially parallel) to the upper surface of the substrate SUB. A first element insulating film 38_3, a second element insulating film 391 and a third element insulating film 392 may be sequentially provided along the sixth direction DR6 on the core 30.

A first end of the light-emitting element ED_2 may be located on the first electrode 210, while a second end thereof may be located on the second electrode 220. It should be understood that the present disclosure is not limited thereto. The first end of the light-emitting element ED_2 may be located on the second electrode 220, while the second end thereof may be located on the first electrode 210.

The second insulating layer 520 may be provided on the light-emitting element ED_2. The second insulating layer 520 may be provided to surround the outer surface of the light-emitting element ED_2. The second insulating layer 520 may be provided on the first element insulating film 38_3, the second element insulating film 391 and the third element insulating film 392 of the light-emitting element ED_2, and may surround the outer surface of the third element insulating film 392 of the light-emitting element ED_2 that faces the display direction DR6.

The first connection electrode 710 may be in contact with a first end of the light-emitting element ED_2 exposed by the second insulating layer 520. For example, the first connection electrode 710 may be provided to surround (e.g., be around) an end surface of the light-emitting element ED_2 exposed by the second insulating layer 520. The first connection electrode 710 may be in contact with the element electrode layer 37 and the first element insulating film 38 surrounding the outer surface of the light-emitting element ED_2.

The second connection electrode 720 may be in contact with the second end of the light-emitting element ED_2 exposed by the second insulating layer 520. For example, the second connection electrode 720 may be provided to surround the opposite end surface of the light-emitting element ED_2 exposed by the second insulating layer 520. The second connection electrode 720 may be in contact with the first semiconductor layer 31 and the first element insulating film 38 surrounding the outer surface of the light-emitting element ED_2.

According to the present embodiments, the height difference of the lower surface of the first semiconductor layer 31 of the light-emitting element ED_2 can be reduced, so that the light-emitting efficiency of the display device 10 can be improved.

In concluding the detailed description, those skilled in the art will appreciate that many variations and modifications can be made to the present embodiments without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A light-emitting element comprising:
a core comprising a first semiconductor layer, a second semiconductor layer on the first semiconductor layer, and an emissive layer between the first semiconductor layer and the second semiconductor layer; and
a first element insulating film around a side surface of the core,
wherein the first element insulating film comprises a composite of an insulating member and an elastic member, such that a space between materials of the insulating member is filled with the elastic member, and
wherein the first element insulating film comprises an interface formed between the insulating member and the elastic member, and the interface directly contacts a side surface of the emissive layer.

2. The light-emitting element of claim 1, wherein the elastic member is around a border of the materials of the insulating member.

3. The light-emitting element of claim 1, wherein a portion of the elastic member is around a side surface of the first semiconductor layer.

4. The light-emitting element of claim 3, wherein the insulating member is on the elastic member and a portion of the insulating member is around a side surface of the second semiconductor layer.

5. The light-emitting element of claim 3, wherein the first element insulating film comprises a plurality of layers of the insulating member and the elastic member arranged alternately with each other.

6. The light-emitting element of claim 1, wherein the insulating member comprises at least one of amorphous $SiO_2$ or amorphous $Al_2O_3$.

7. The light-emitting element of claim 1, wherein the elastic member comprises at least one of graphene or carbon nanotubes.

8. The light-emitting element of claim 1, wherein the elastic member comprises an insulating material having an elastic modulus of 150 GPa or more.

9. The light-emitting element of claim 8, wherein the elastic member comprises at least one of $HfO_2$ or $ZrO_2$.

10. A light-emitting element comprising:
a core comprising a first semiconductor layer, a second semiconductor layer on the first semiconductor layer, and an emissive layer between the first semiconductor layer and the second semiconductor layer;
a first element insulating film around a side surface of the core; and
a second element insulating film around an outer surface of the first element insulating film,
wherein the first element insulating film comprises a crystalline insulating material,
wherein an elastic modulus of the first element insulating film is greater than an elastic modulus of the second element insulating film, wherein the first element insulating film comprises a composite of an insulating member and an elastic member, such that a space between materials of the insulating member is filled with the elastic member, and wherein the first element insulating film comprises an interface formed between the insulating member and the elastic member, and the interface directly contacts a side surface of the emissive layer.

11. The light-emitting element of claim 10, wherein the first element insulating film has an elastic modulus of 150 GPa or more.

12. The light-emitting element of claim 11, wherein the first element insulating film comprises at least one of $HfO_2$ or $ZrO_2$.

13. The light-emitting element of claim 12, wherein the first element insulating film comprises a composite material doped with at least one of aluminum (AI), scandium (Sc), yttrium (Y), lanthanum (La), lutetium (Lu), or lawrencium (Lr).

14. The light-emitting element of claim 13, wherein the second element insulating film comprises at least one of amorphous $SiO_2$ or amorphous $Al_2O_3$.

15. A display device comprising:
a first electrode and a second electrode on a substrate and spaced apart from each other;
light-emitting elements between the first electrode and the second electrode, each light-emitting element having a first end and a second end;
a first connection electrode in contact with the first end of each of the light-emitting elements; and
a second connection electrode in contact with the second end of each of the light-emitting elements,
wherein each of the light-emitting elements comprises:
a core comprising a first semiconductor layer, a second semiconductor layer on the first semiconductor layer, and an emissive layer between the first semiconductor layer and the second semiconductor layer; and a first element insulating film around a side surface of the core, wherein the first element insulating film comprises a crystalline insulating material with an elastic modulus of 150 GPa or more, wherein the first element insulating film further comprises an amorphous insulating material, and forms a composite of the amorphous insulating material and the crystalline insulating material, and wherein the first semiconductor layer, the emissive layer, and the second semiconductor layer are sequentially arranged in a direction crossing a thickness direction of the substrate.

16. The display device of claim 15, wherein the first element insulating film comprises at least one of $HfO_2$ or $ZrO_2$.

17. The display device of claim 15, wherein each of the light-emitting elements comprises a second element insulating film around a side surface of the first element insulating film, wherein the second element insulating film comprises an amorphous insulating material with an elastic modulus of 150 GPa or less, and wherein the core, the first element insulating film, and the second element insulating film are sequentially arranged in a thickness direction of the substrate.

18. The display device of claim 17, wherein the second element insulating film comprises at least one of $SiO_2$ or $Al_2O_3$.

19. The display device of claim 15, wherein the first element insulating film comprises a plurality of layers of the amorphous insulating material and the crystalline insulating material arranged alternately with each other.

20. An electronic device comprising:

a first electrode and a second electrode on a substrate and spaced apart from each other;

light-emitting elements between the first electrode and the second electrode, each light-emitting element having a first end and a second end;

a first connection electrode in contact with the first end of each of the light-emitting elements; and a second connection electrode in contact with the second end of each of the light-emitting elements, wherein each of the light-emitting elements comprises:

a core comprising a first semiconductor layer, a second semiconductor layer on the first semiconductor layer, and an emissive layer between the first semiconductor layer and the second semiconductor layer; and a first element insulating film around a side surface of the core, wherein the first element insulating film comprises a crystalline insulating material with an elastic modulus of 150 GPa or more, wherein the first element insulating film further comprises an amorphous insulating material, and forms a composite of the amorphous insulating material and the crystalline insulating material, and wherein the first semiconductor layer, the emissive layer, and the second semiconductor layer are sequentially arranged in a direction crossing a thickness direction of the substrate.

* * * * *